United States Patent
Kent et al.

(10) Patent No.: US 9,812,184 B2
(45) Date of Patent: *Nov. 7, 2017

(54) CURRENT INDUCED SPIN-MOMENTUM TRANSFER STACK WITH DUAL INSULATING LAYERS

(71) Applicant: New York University, New York, NY (US)

(72) Inventors: Andrew Kent, New York, NY (US); Daniel Bedau, San Jose, CA (US); Huanlong Liu, New York, NY (US)

(73) Assignee: NEW YORK UNIVERSITY, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/253,416

(22) Filed: Aug. 31, 2016

(65) Prior Publication Data

US 2017/0236570 A1   Aug. 17, 2017

Related U.S. Application Data

(60) Continuation of application No. 14/792,753, filed on Jul. 7, 2015, now Pat. No. 9,449,668, which is a
(Continued)

(51) Int. Cl.
*G11C 11/14* (2006.01)
*G11C 11/16* (2006.01)
(Continued)

(52) U.S. Cl.
CPC ........ *G11C 11/161* (2013.01); *G11C 11/1653* (2013.01); *G11C 11/1673* (2013.01);
(Continued)

(58) Field of Classification Search
CPC ............. H01L 27/222; H01L 29/66984; H01L 45/1233; G11C 11/161; G11C 11/16; G11C 11/155
(Continued)

(56) References Cited

U.S. PATENT DOCUMENTS 5,541,868 A   7/1996 Prinz
5,541,888 A   7/1996 Russell
(Continued)

FOREIGN PATENT DOCUMENTS

CA   2766141   1/2011
EP   1 345 277 A1   9/2003
(Continued)

OTHER PUBLICATIONS

US 7,026,672, 04/2006, Pakala et al. (withdrawn)
(Continued)

*Primary Examiner* — Fernando Hidalgo
(74) *Attorney, Agent, or Firm* — Foley & Lardner LLP

(57) ABSTRACT

A high speed, low power method to control and switch the magnetization direction of a magnetic region in a magnetic device for memory cells using spin polarized electrical current. The magnetic device comprises a pinned magnetic layer, a reference magnetic layer with a fixed magnetization direction and a free magnetic layer with a changeable magnetization direction. The magnetic layers are separated by insulating non-magnetic layers. A current can be applied to the device to induce a torque that alters the magnetic state of the device so that it can act as a magnetic memory for writing information. The resistance, which depends on the magnetic state of the device, can be measured to read out the information stored in the device.

20 Claims, 33 Drawing Sheets

Related U.S. Application Data continuation of application No. 14/264,685, filed on Apr. 29, 2014, now Pat. No. 9,236,103, which is a continuation of application No. 13/298,190, filed on Nov. 16, 2011, now Pat. No. 8,755,222, which is a continuation-in-part of application No. 13/041,104, filed on Mar. 4, 2011, now Pat. No. 8,363,465, which is a division of application No. 12/490,588, filed on Jun. 24, 2009, now Pat. No. 7,911,832, which is a continuation-in-part of application No. 11/932,745, filed on Oct. 31, 2007, now Pat. No. 7,573,737.

(60) Provisional application No. 61/414,724, filed on Nov. 17, 2010.

(51) Int. Cl.
*H01L 27/22* (2006.01)
*H01L 43/10* (2006.01)
*H01L 43/08* (2006.01)

(52) U.S. Cl.
CPC ...... *G11C 11/1675* (2013.01); *G11C 11/1697* (2013.01); *H01L 27/226* (2013.01); *H01L 43/08* (2013.01); *H01L 43/10* (2013.01)

(58) Field of Classification Search
USPC ................ 365/173, 171, 158, 131, 130, 170
See application file for complete search history.

(56) References Cited

U.S. PATENT DOCUMENTS

| | | |
|---|---|---|
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,796 B1 | 6/2001 | Lenssen et al. |
| 6,252,798 B1 | 6/2001 | Satoh et al. |
| 6,256,223 B1 | 7/2001 | Sun |
| 6,272,036 B1 | 8/2001 | You et al. |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,603,677 B2 | 8/2003 | Redon et al. |
| 6,653,154 B2 | 11/2003 | Doan et al. |
| 6,654,278 B1 | 11/2003 | Engel et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,773,515 B2 | 8/2004 | Li et al. |
| 6,777,730 B2 | 8/2004 | Daughton et al. |
| 6,812,537 B2 | 11/2004 | Okazawa et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,009,877 B1 | 3/2006 | Huai et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,573,737 B2 | 8/2009 | Kent et al. |
| 7,911,832 B2 | 3/2011 | Kent et al. |
| 8,279,666 B2 | 10/2012 | Dieny et al. |
| 8,363,465 B2 | 1/2013 | Kent et al. |
| 8,755,222 B2 | 6/2014 | Kent et al. |
| 8,982,613 B2 | 3/2015 | Kent |
| 2002/0090533 A1 | 7/2002 | Zhang et al. |
| 2002/0105823 A1 | 8/2002 | Redon et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0094785 A1 | 5/2004 | Zhu et al. |
| 2004/0130936 A1 | 7/2004 | Nguyen et al. |
| 2005/0041342 A1 | 2/2005 | Huai et al. |
| 2005/0041462 A1 | 2/2005 | Kent et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0242501 A1 | 10/2007 | Hung et al. |
| 2008/0112094 A1 | 5/2008 | Kent et al. |
| 2008/0151614 A1 | 6/2008 | Guo |
| 2008/0239589 A1 | 10/2008 | Guo et al. |
| 2008/0297292 A1 | 12/2008 | Viala et al. |
| 2009/0072185 A1 | 3/2009 | Raksha et al. |
| 2009/0098413 A1 | 4/2009 | Kanegae |
| 2009/0141540 A1 | 6/2009 | Miura et al. |
| 2009/0296462 A1 | 12/2009 | Kent et al. |
| 2010/0027870 A1 | 2/2010 | Rodrigues et al. |
| 2010/0124091 A1 | 5/2010 | Cowburn |
| 2010/0140726 A1 | 6/2010 | Apalkov et al. |
| 2010/0195380 A1 | 8/2010 | Wang et al. |
| 2010/0226169 A1 | 9/2010 | Gao et al. |
| 2011/0007560 A1 | 1/2011 | Dieny et al. |
| 2011/0141791 A1 | 6/2011 | Ahmed |
| 2012/0069646 A1 | 3/2012 | Kramer et al. |
| 2012/0069649 A1 | 3/2012 | Ranjan et al. |

(56) References Cited

U.S. PATENT DOCUMENTS

| | | |
|---|---|---|
| 2012/0261776 A1 | 10/2012 | Tang et al. |
| 2012/0294078 A1 | 11/2012 | Kent et al. |
| 2013/0075845 A1 | 3/2013 | Chen et al. |
| 2014/0008742 A1 | 1/2014 | Chen et al. |

FOREIGN PATENT DOCUMENTS

| | | |
|---|---|---|
| EP | 2 182 532 | 5/2010 |
| FR | 2817998 | 6/2002 |
| FR | 2832542 | 5/2003 |
| FR | 2910716 | 6/2008 |
| JP | 01-004012 A | 1/1998 |
| JP | 10-004012 A | 1/1998 |
| JP | 11-120758 | 4/1999 |
| JP | 11-353867 | 12/1999 |
| JP | 2001-195878 A | 7/2001 |
| JP | 2002-261352 | 9/2002 |
| JP | 2002-357489 | 12/2002 |
| JP | 2003-318461 | 11/2003 |
| JP | 2005-150482 | 6/2005 |
| JP | 2005-535111 | 11/2005 |
| JP | 2006-128579 | 5/2006 |
| JP | 2007-525005 | 8/2007 |
| JP | 2008-177421 | 7/2008 |
| JP | 2008-524830 A | 7/2008 |
| JP | 2009-027177 | 2/2009 |
| JP | 2010-109372 | 5/2010 |
| WO | WO-2005/020251 | 3/2005 |
| WO | WO-2009/059071 | 5/2009 |
| WO | WO-2009/080636 | 7/2009 |

OTHER PUBLICATIONS

Chinese 2nd Office Action for Appl. No. 201180063255.7; dated Apr. 3, 2015, 9 pages.
Chinese 3rd Office Action for Appl. No. 201180063255.7 English translation, dated Jun. 17, 2015, 4 pages.
Decision of Rejection dated Mar. 18, 2014 for Japanese Appl. No. 2012-043157, 5 pages.
Declaration of Sanjay K. Banerjee, Ph.D., Inter Partes Review of U.S. Pat. No. 6,980,469, IPR2014-00047, dated Oct. 9, 2013, 288 pages.
European Extended Search Report for Application No. 14198308.0, dated Apr. 8, 2015, 4 pages.
First Office Action (with English Translation) in Japanese Patent Application No. 2006-524031, dated May 10, 2011, (8 pgs.).
Ingvarsson, S., et al., "Tunable magnetization damping in transition metal ternary alloys", Applied Physics Letters, vol. 85, No. 21, Nov. 22, 2004., pp. 4995-4997.
Japanese Final Office Action for Appl. No. 2013-257366, Dated Mar. 30, 2015, 3 pages.
Japanese Final Office Action for Appl. No. 2013-539989, Dated Apr. 6, 2015, 9 pages.
Korean Office Action for Appl. No. 10-2013-7015305 with English summary, dated May 29, 2015, 4 pages.
Lee et al., Analytical investigation of spin-transfer dynamics using a perpendicular-to-plane polarizer, Applied Physics Letters 86, pp. 022505-1-022505-3 (2005).
Martens et al., "Magnetic Reversal in nanoscopic Ferromagnetic Rings", NSF grants PHY-0351964 (DLS), 2006, 23 pages.
Martens et al., "Thermally Induced Magnetic Switching in Thin Ferromagnetic Annuli", NSF grants PHY-0351964 (DLS), 2005, 11 pages.
New York University's Patent Owner Preliminary Response, IPR2014-00047, dated Jan. 17, 2014, 59 pages.
Non-Final Office Action for U.S. Appl. No. 13/298,190, dated Jul. 2, 2013, (20 pgs.).
Non-Final Office Action on U.S. Appl. No. 13/720,290, dated May 14, 2013, (20 pgs.).
Notice of Allowance for U.S. Appl. No. 13/720,290, dated Sep. 12, 2013.
Notice of Allowance on U.S. Appl. No. 12/490,588, dated Feb. 3, 2011, (11 pgs.).
Notice of Allowance on U.S. Appl. No. 13/041,104, dated Sep. 21, 2012, (7pgs.).
Notice of Reasons for Rejection received for JP 2012-043157 dated Sep. 3, 2013.
Notification of Provisional Rejection for Korean Appl. No. 10-2010-701155, dated Dec. 10, 2014, 6 pages.
Notification of Provisional Rejection received for Korean Appl. No. 10-2012-7001872 dated Jun. 5, 2013.
Notification of Provisional Rejection received from Korean App. No. 10-2013-7023576 dated Oct. 22, 2013. 3 pages.
Notification of Reasons for Refusal in Japanese Patent Application No. 2013-257367, dated Feb. 12, 2015 with English Translation, 6 pages.
Notification of Reasons for Refusal received in Japanese Appln. No. 2012-517632 dated Jul. 17, 2013.
Notification of Reasons of Refusal for Japanese Appl. No. 2013-257366, dated Dec. 3, 2014, 3 pages.
Notification of the Third Office Action received for Chinese Application No. 200880119942.4, dated Dec. 16, 2013, 3 pages.
Observations by a third party concerning patentability in European App. No. 04781554.3 dated Dec. 13, 2013, 3 pages.
Office Action for Canada App. No. 2,535,965, dated Dec. 12, 2014 3 pages.
Office Action for Canadian Application No. 2,766,141, dated Sep. 4, 2013, 4 pages.
Office Action for Canadian application No. 2,766,141 dated May 22, 2014, 3 pages.
Office Action issued by the Chinese Patent Office, Oct. 29, 2012, Chinese Application No. 200880119942.4, 10 pages.
Office Action on U.S. Appl. No. 13/041,104, dated Apr. 6, 2012, (17 pgs.).
Office Action received for JP 2010-531338 dated Jun. 18, 2013.
PCT International Search Report and Written Opinion on Int'l. Application No. PCT/US2010/039373, dated Jan. 5, 2011, (5 pgs.).
Petition for Inter Partes Review of U.S. Pat. No. 6,980,469, IPR2014-00047, dated Oct. 10, 2013, 62 pages.
Second Notification of Provisional Rejection for Korean Patent Application No. 10-2012-7001872, dated Dec. 30, 2013, 37 pages.
Supplementary European Search Report received for EP 10797550.0 completed Jul. 22, 2013 and dated Sep. 16, 2013.
U.S. Notice of Allowance for U.S. Appl. No. 13/298,190, dated Feb. 7, 2014, 6 pages.
U.S. Notice of Allowance for U.S. Appl. No. 13/720,290, dated Feb. 7, 2014, 6 pages.
U.S. Notice of Allowance for U.S. Appl. No. 13/720,290, dated Oct. 25, 2013, 10 pages.
U.S. Notice of Allowance on 046434-0277 DTD Sep. 30, 2013.
U.S. Office Action for U.S. Appl. No. 14/264,685, dated Jun. 5, 2015, 8 pages.
U.S. Notice of Allowance for U.S. Appl. No. 14/264,685, dated Sep. 25, 2015, 9 pages.
Firastrau et al., "Spin-torque nano-oscillator based on a synthetic antiferromagnet free layer and perpendicular to plane polarizer", J. Appl. Phys. 113, 113908 (2013).
Non-Final Office Action on U.S. Appl. No. 14/622,453, dated Jan. 7, 2016. 17 pages.
Notification of Reasons for Refusal in Japanese Patent Application No. 2013-257367, dated Nov. 11, 2015 with English Translation, 6 pages.
Notification of Transmittal of the International Search Report and the Written Opinion of the International Searching Authority, or the Declaration for PCT/US2014/42135, dated Oct. 23, 2014, 8 pages.
Stiles et al., "Spin-Transfer Torque and Dynamic", Spin Dynamics in Confined Magnetic Structures III, Topics in Applied Physics vol. 101, pp. 225-308 (2006).
U.S. Notice of Allowance for U.S. Appl. No. 13/298,190, dated Oct. 28, 2013, 8 pages.

(56) References Cited

OTHER PUBLICATIONS

U.S. Notice of Allowance for U.S. Appl. No. 13/919,466, dated Nov. 10, 2014, 9 pages.
U.S. Office Action for U.S. Appl. No. 13/919,466, dated May 13, 2014, 29 pages.

Demagnetizing Field

Two current pulses

One short current pulse

Demagnetizing Field

Demagnetizing Field

Demagnetizing Field

Two current pulses

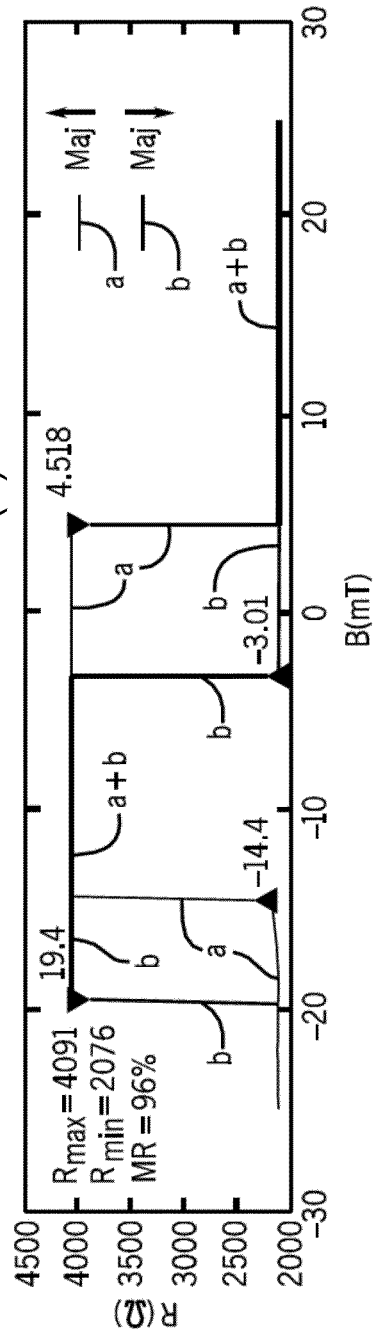
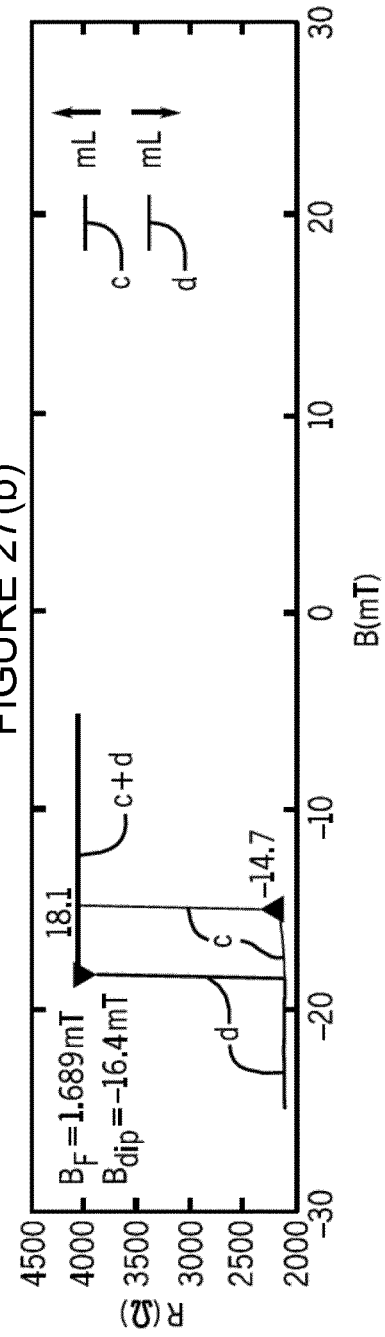
FIGURE 27(a)
FIGURE 27(b)

CURRENT INDUCED SPIN-MOMENTUM TRANSFER STACK WITH DUAL INSULATING LAYERS

CROSS-REFERENCE TO RELATED PATENT APPLICATIONS

This application is a continuation of U.S. patent application Ser. No. 14/792,753, filed Jul. 7, 2015, now U.S. Pat. No. 9,449,668, which is a continuation of U.S. patent application Ser. No. 14/264,685, filed on Apr. 29, 2014, now U.S. Pat. No. 9,236,103, which is a continuation of U.S. patent application Ser. No. 13/298,190, filed Nov. 16, 2011, now U.S. Pat. No. 8,755,222, which claims the benefit of U.S. Provisional Application No. 61/414,724 filed Nov. 17, 2010. U.S. patent application Ser. No. 13/298,190 is also a continuation-in-part of U.S. patent application Ser. No. 13/041,104, filed Mar. 4, 2011, now U.S. Pat. No. 8,363,465, which is a divisional application of U.S. patent application Ser. No. 12/490,588, filed Jun. 24, 2009, now U.S. Pat. No. 7,911,832, which is a continuation-in-part of Ser. No. 11/932,745, filed Oct. 31, 2007 now U.S. Pat. No. 7,573,737. All of these applications are incorporated herein by reference in their entirety.

GOVERNMENT RIGHTS

This invention was made with government support under Contract Number NSF-DMR-0706322 entitled "Spin Transfer in Magnetic Nanostructures" and NSF-PHY-0601179 entitled "Noise-Induced Escape in Multistable Systems" awarded by the National Science Foundation, and Contract Number ARO-W911NF-07-1-0643 entitled "Electronics: Ultra-Fast Magnetoelectronic Devices" awarded by the Army Research Office. The government has certain rights in the invention.

FIELD OF THE INVENTION

The present invention generally relates to magnetic devices used in memory and information processing applications, such as giant magnetoresistance (GMR) devices. More specifically, the present invention describes a high speed and low power method by which a spin polarized electrical current can be used to control and switch the direction of magnetization and/or helicity of a magnetic region in such a device.

BACKGROUND OF THE INVENTION

Magnetic devices that use a flow of spin-polarized electrons are of interest for magnetic memory and information processing applications. Such a device generally includes at least two ferromagnetic electrodes that are separated by a non-magnetic material, such as a metal or insulator. The thicknesses of the electrodes are typically in the range of 1 nm to 50 nm. If the non-magnetic material is a metal, then this type of device is known as a giant magnetoresistance or spin-valve device. The resistance of the device depends on the relative magnetization orientation of the magnetic electrodes, such as whether they are oriented parallel or anti-parallel (i.e., the magnetizations lie on parallel lines but point in opposite directions). One electrode typically has its magnetization pinned, i.e., it has a higher coercivity than the other electrode and requires larger magnetic fields or spin-polarized currents to change the orientation of its magnetization. The second layer is known as the free electrode and its magnetization direction can be changed relative to the former. Information can be stored in the orientation of this second layer. For example, "1" or "0" can be represented by anti-parallel alignment of the layers and "0" or "1" by parallel alignment. The device resistance will be different for these two states and thus the device resistance can be used to distinguish "1" from "0." An important feature of such a device is that it is a non-volatile memory, since the device maintains the information even when the power is off, like a magnetic hard drive. The magnet electrodes can be sub-micron in lateral size and the magnetization direction can still be stable with respect to thermal fluctuations.

In conventional magnetic random access memory (MRAM) designs, magnetic fields are used to switch the magnetization direction of the free electrode. These magnetic fields are produced using current carrying wires near the magnetic electrodes. The wires must be small in cross-section because memory devices consist of dense arrays of MRAM cells. As the magnetic fields from the wires generate long-range magnetic fields (magnetic fields decay only as the inverse of the distance from the center of the wire) there will be cross-talk between elements of the arrays, and one device will experience the magnetic fields from the other devices. This cross-talk will limit the density of the memory and/or cause errors in memory operations. Further, the magnetic fields generated by such wires are limited to about 0.1 Tesla at the position of the electrodes, which leads to slow device operation. Importantly, conventional memory designs also use stochastic (random) processes or fluctuating fields to initiate the switching events, which is inherently slow and unreliable (see, for example, R. H. Koch et al., Phys. Rev. Lett. 84, 5419 (2000)).

In U.S. Pat. No. 5,695,864 and several other publications (e.g., J. Slonckewski, Journal of Magnetism and Magnetic Materials 159, L1 (1996)), John Slonckewski described a mechanism by which a spin-polarized current can be used to directly change the magnetic orientation of a magnetic electrode. In the proposed mechanism, the spin angular momentum of the flowing electrons interacts directly with the background magnetization of a magnetic region. The moving electrons transfer a portion of their spin-angular momentum to the background magnetization and produce a torque on the magnetization in this region. This torque can alter the direction of magnetization of this region and switch its magnetization direction. Further, this interaction is local, since it only acts on regions through which the current flows. However, the proposed mechanism was purely theoretical.

Slonckewski's patent describes MRAM devices that use spin-momentum transfer for magnetic switching. However, the proposed devices are slow and rely on fluctuating magnetic fields and stochastic processes to initiate magnetization switching. Further, large current densities are needed to switch the devices. In describing the preferred embodiment of his "latch or logic gate," Slonckewski states " . . . the preferred axes of the 3 magnets F1, F2, and F3 are all "vertical" (i.e., in the same direction or orientation) as discussed above. Other orientations can serve as long as they are parallel to the same axis." As we describe below, our device makes use of layer magnetizations that are not parallel to the same axis, to great advantage in speed, reliability, and power consumption.

Spin-transfer torque magnetic random access memory (STT-MRAM) devices hold great promise as a universal memory. STT-MRAM is non-volatile, has a small cell size, high endurance and may match the speed of static RAM (SRAM). A disadvantage of the common collinearly magnetized STT-MRAM devices is that they often have long mean switching times and broad switching time distributions. This is associated with the fact that the spin-torque is non-zero only when the layer magnetizations are misaligned. Spin transfer switching thus requires an initial misalignment of the switchable magnetic (free) layer, e.g. from a thermal fluctuation. Relying on thermal fluctuations leads to incoherent reversal with an unpredictable incubation delay, which can be several nanoseconds.

Spin-transfer torque magnetic random access memory (STT-MRAM) devices use current or voltage pulses to change the magnetic state of an element to write information. In all STT-MRAM devices known to date, voltage/current pulses of both positive and negative polarities are needed for device operation. For example, positive pulses are needed to write a "1" and negative polarity pulses are needed to write a "0". (Of course, the definition of which magnetic state represents a "1" and which a "0" is arbitrary.) This magnetic element typically has two possible states, magnetization oriented either "left" or "right", parallel or antiparallel to the magnetization of a reference layer in the device. These two magnetic states have different resistances, which can be used to read-out the information electrically.

Using present complementary metal-oxide-semiconductor (CMOS) technology, circuitry is needed to control the signals to STT-MRAM cells. Prior STT-MRAM devices required bipolar sources and the bit cells were set to one state by one polarity and the other state by the other polarity, i.e. unipolar That is, the source needed to be able to provide both polarities because each polarity only could write either "0" or "1". Although reading can be done with a unipolar voltage/current source, writing information required a bipolar source.

U.S. Pat. No. 6,256,223 to Jonathan Sun also describes devices that use current-induced magnetic switching and demonstrates in experiment the operation of such devices. However, the devices proposed were unreliable, as there was little consistency with regard to device characteristics. Further, the estimated time scale for magnetic switching was 50 nsec for operation at large current densities.

Devices are needed that exhibit high speed and reliable operation under the action of a spin-polarized current. This includes devices that operate with lower power and have lower threshold currents for switching the magnetization orientation.

SUMMARY OF THE INVENTION

In view of the limitations associated with conventional designs of devices that use spin-momentum transfer, an object of the present invention is to provide a structure that is optimal for a magnetic memory or magnetic information processing device.

It is another object of the present invention to produce a magnetic device that has advantages in terms of speed of operation.

It is a further object of the present invention to produce a magnetic device that has advantages in terms of reliability.

It is a further object of the present invention to produce a magnetic device that requires lower power to operate.

It is a further object of the present invention to produce a magnetic device that has advantages in terms of the stability of the stored information.

It is a further object of the present invention to produce a magnetic device that has a large read-out signal.

These and additional objects of the invention are accomplished by a device that employs magnetic layers in which the layer magnetization directions do not lie along the same axis. For instance in one embodiment, two magnetic regions have magnetizations that are orthogonal.

The invention is a magnetic device comprised of ferromagnetic and non-magnetic layers through which current can flow. The magnetic device is comprised of a ferromagnetic layer with a fixed magnetization direction and another ferromagnetic layer separated from the first by a non-magnetic region that has a magnetization that is free to rotate in response to applied currents. A third ferromagnetic layer, again, separated from the others by a non-magnetic layer, has a fixed magnetization direction and can be employed to readout the magnetization direction of the free ferromagnetic layer. The magnetization directions of the ferromagnetic layers are not all along the same axis. In one of the preferred embodiments, the first fixed ferromagnetic layer's magnetization direction is perpendicular to the plane of the layer, while the free ferromagnetic layer's magnetization is in the plane of the layer. As described above, a current flow between the layers transfers spin-angular momentum from the fixed magnetization layer to the free magnetization layer and produces a torque on the magnetization of the free layer. The torque is proportional to the vector triple product of the magnetization direction of the fixed and free layer, with a factor of proportionality that depends on the current and the spin polarization of the current. A large torque is produced when the magnetization directions of the fixed and free layers are orthogonal.

This large torque acting on the magnetization direction of the free magnetic layer causes the magnetization of the free magnetic layer to rotate out of the plane of the layer. Since the thickness of the free magnetic layer is less than the width and length dimensions, the rotation of the magnetization of the free magnetic layer out of the plane of the layer generates a large magnetic field, a 'demagnetizing' field, which is perpendicular to the plane of the layer.

This demagnetizing field forces the magnetization vector of the free magnetic layer to precess, i.e., for the magnetization direction to rotate around the direction of the demagnetization magnetic field. The demagnetizing field also determines the rate of precession. A large demagnetizing field results in a high precession rate, which is an optimal condition for fast magnetic switching. An advantage of this magnetic device is that random fluctuating forces or fields are not necessary to initiate or control the magnetic response of the layers.

A further aspect of the invention provides a magnetic device including a reference magnetic layer having a fixed magnetic helicity and/or a fixed magnetization direction, a free magnetic layer with at least one magnetization vector having a changeable magnetization helicity, and non-magnetic layer spatially separating said free magnetic layer and said reference magnetic layer. The magnetization helicity of the free magnetic layer can be changed using current induced spin-momentum transfer. In one preferred embodiment, the device has a substantially ring shaped structure, and the reference magnetic layer includes an easy axis substantially perpendicular to the reference layer and a fixed magnetization perpendicular to the plane of the reference layer. Alternatively, the reference layer includes an easy axis substantially perpendicular to the reference layer and a magnetic helicity substantially clockwise or counter-clockwise about the ring-shaped structure.

BRIEF DESCRIPTION OF THE DRAWINGS

The foregoing and other features of the present invention will be more readily apparent from the following detailed description and drawings of the illustrative embodiments of the invention wherein like reference numbers refer to similar elements throughout the views and in which:

FIG. 24(b) AP to P state wherein the switching is bipolar, occurring for both positive and negative pulse polarities;

FIGS. 27(a)-27(c) illustrate typical device characteristics for a 50 nm×115 nm ellipse shaped bit cell; the resistance is measured as a function of applied in-plane magnetic field; FIG. 27(a) shows the applied field induced switching of the reference and free layers; FIG. 27(b) shows the applied field induced switching of just the reference layer and FIG. 27(c) shows the applied field induced switching of just the free layer;

DETAILED DESCRIPTION OF THE EMBODIMENTS

Structure of a Basic Magnetic Device

Figure 1:
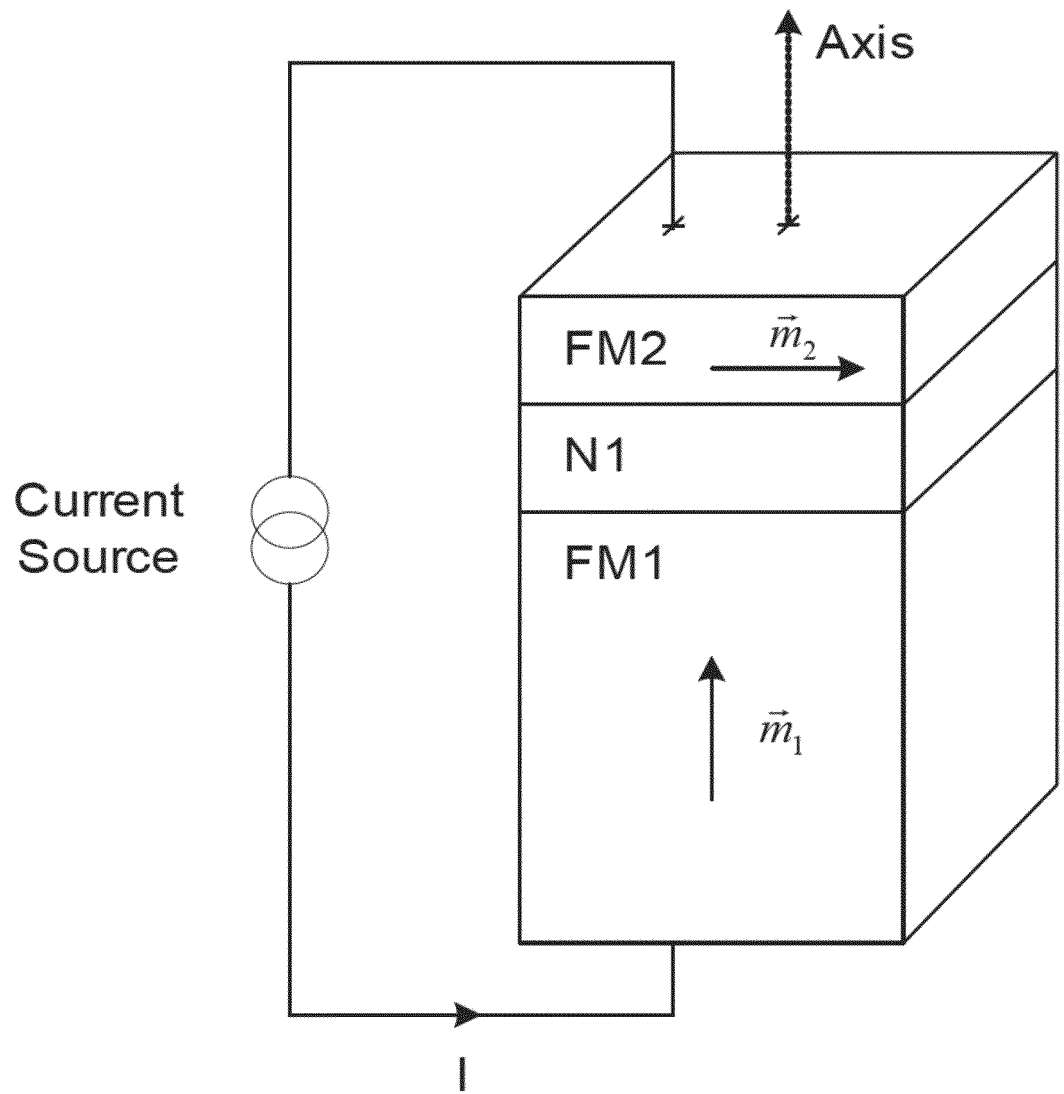
FIG. 1 is an illustration of a magnetic device according to the present invention.

To illustrate the basic concept, FIG. 1 shows a multilayered, pillar-shaped magnetic device comprising a pinned magnetic layer FM1 with a fixed magnetization direction and a free magnetic layer FM2 with a free magnetization direction. $\vec{m}_1$ Is the magnetization vector of the pinned magnetic layer FM1, and $\vec{m}_2$ is the magnetization vector of the free magnetic layer FM2. The pinned magnetic layer FM1 acts as a source of spin angular momentum.

The pinned magnetic layer FM1 and the free magnetic layer FM2 are separated by a first non-magnetic layer N1 that spatially separates the two layers FM1 and FM2 such that their mutual magnetic interaction is minimized. The pillar-shaped magnetic device is typically sized in nanometers, e.g., it may be less than approximately 200 nm laterally.

The free magnetic layer FM2 is essentially a magnetic thin film element imbedded in a pillar-shaped magnetic device with two additional layers—the pinned magnetic layer FM1 and the non-magnetic layer N1. The layer thicknesses are typically approximately 1 nm to 50 nm.

These pillar-shaped magnetic devices can be fabricated in a stacked sequence of layers by many different means, including sputtering, thermal and electron-beam evaporation through a sub-micron stencil mask. These magnetic devices can also be fabricated in a stack sequence using sputtering, thermal and electron-beam evaporation to form a multilayered film followed by a subtractive nanofabrication process that removes materials to leave the pillar-shaped magnetic device on a substrate surface, such as that of a silicon of other semiconducting or insulating wafer.

Materials for the ferromagnetic layers include (but are not limited to) Fe, Co, Ni, and alloys of these elements, such as $Ni_{1-x}Fe_x$; alloys of these ferromagnetic metals with non-magnetic metals, such as Cu, Pd, Pt, NiMnSb, at compositions in which the materials are ferromagnetically ordered at room temperature; conducting materials; and conducting magnetic oxides such as $CrO_2$ and $Fe_3O_4$. For the nonmagnetic layers, materials include (but are not limited to) Cu, Cr, Au, Ag, and Al. The main requirement for the non-magnetic layer is the absence of scattering of the electron spin-direction on a short length scale, which is less than about the layer thickness.

An electric current source is connected to the pinned magnetic layer FM1 and the free magnetic layer FM2 so that an electric current I can traverse the pillar device.

Method of Magnetic Switching

An electric current I is applied to the pillar-shaped magnetic device so that the current I flows through the various layers of the device, from the pinned magnetic layer FM1 to the first non-magnetic layer N1 to the free magnetic layer FM2. The applied current I results in a transfer of angular momentum from the pinned magnetic layer FM1 to the free magnetic layer FM2. As stated above, a transfer of angular momentum from one magnetic region to another can produce a torque.

Figure 2A:
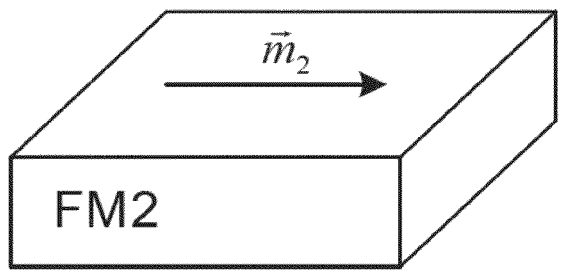
FIGS. 2A-2E are illustrations of the free magnetic layer showing the magnetization vector and the demagnetizing field of the electronic device of FIG. 1 during the application of pulses of current as illustrated in FIG. 3A.

FIGS. 2A-2E show steps in the method of magnetic switching using the magnetic device shown in FIG. 1 and for convenience, FIGS. 2A-2E only show the free magnetic layer FM2 and the magnetization vector $\vec{m}_2$ of the free magnetic layer FM2. FIG. 2A shows the initial state of the free magnetic layer FM2 before the current I is applied.

Figure 2B:
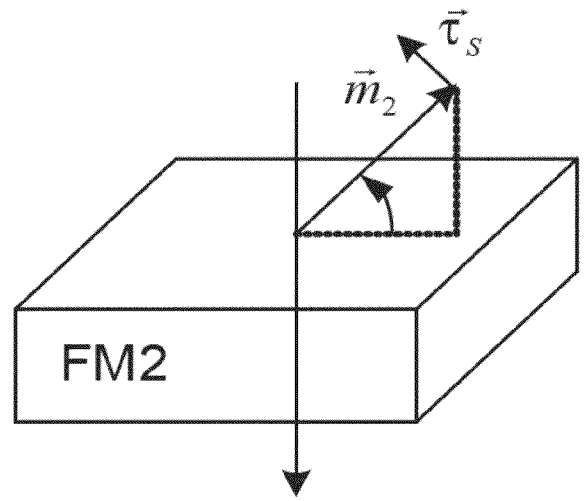
Figure 2C:
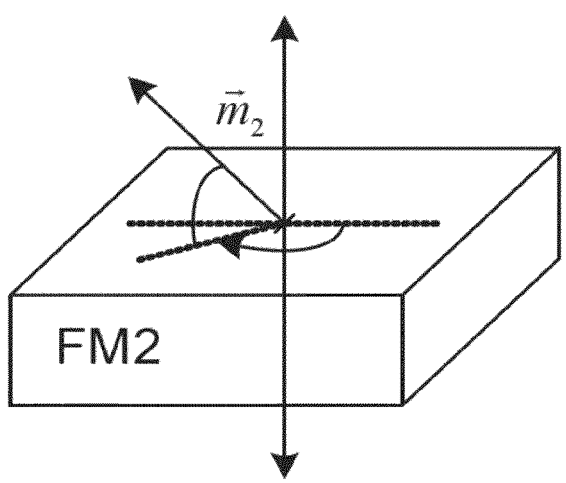
Figure 2D:
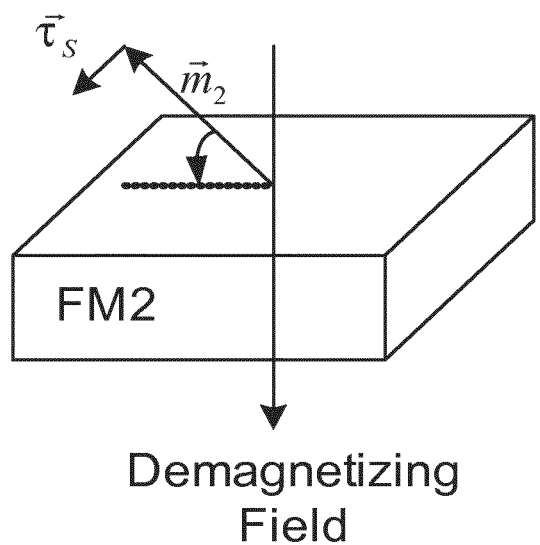
Figure 3A:
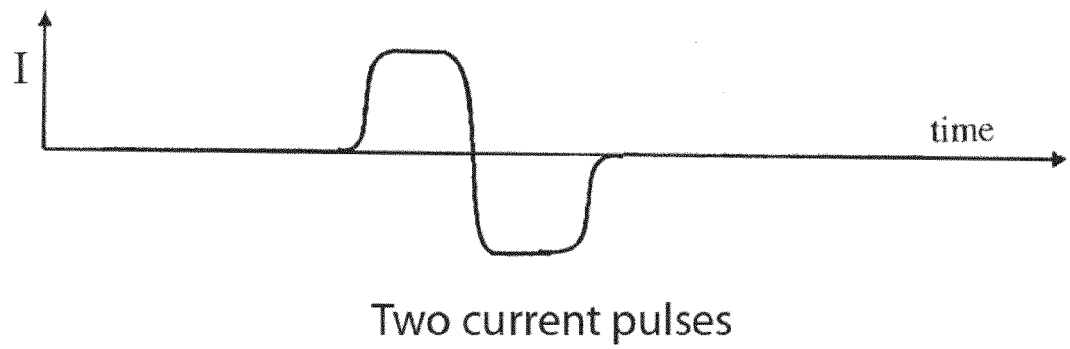
FIG. 3A is an illustration of a current waveform that may be applied to the magnetic device.
Figure 3B:
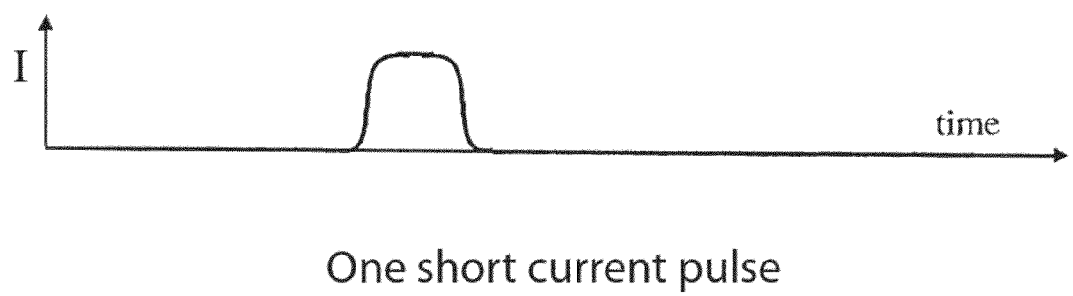
FIG. 3B is an illustration of an alternate current waveform that may be applied to the magnetic device.

As shown in FIGS. 2B-2D, applying a current I, which can be of a form as shown in FIGS. 3A and 3B, results in the transfer of angular momentum from the pinned magnetic layer FM1 to the free magnetic layer FM2. This transfer of angular momentum from the pinned magnetic layer FM1 to the free magnetic layer FM2 produces a torque $\vec{\tau}_S$ on the magnetic moment of the free magnetic layer FM2.

The torque $\vec{\tau}_S$ per unit magnetization of the free layer is proportional to the vector triple product $a_f \hat{m}_2 \times (\hat{m}_2 \times \hat{m}_1)$, where $\hat{m}_2$ is a unit vector in the direction of the magnetic moment of the free magnetic layer FM2 and $\hat{m}_1$ is a unit vector in the direction of the magnetic moment of the pinned magnetic layer FM1. The prefactor, $a_f$, depends on the current I, the spin-polarization P of the current I, and the cosine of the angle between the free and pinned magnetic layers, $\cos(\theta)$, such that $a_f = \hbar \, Ig(P, \cos(\theta))/(eMV)$. $\hbar$ is the reduced Planck's constant, g is a function of the spin-polarization P and $\cos(\theta)$, M is the magnetization density of the free layer, e is the charge of the electron, and V is the volume of the free layer (see, J. Slonczewski, Journal of Magnetism and Magnetic Materials 159, L1 (1996)). Thus, a large torque $\vec{\tau}_S$ is produced when the magnetic moments of the pinned magnetic layer FM1 and the free magnetic layer FM2 are perpendicular.

This torque $\vec{\tau}_S$, which acts on the magnetic moment of the free magnetic layer FM2, causes the magnetization of the free magnetic layer FM2 to rotate out of the plane of the layer. Since the thickness of the free magnetic layer FM2 is less than the width and length dimensions of the free magnetic layer FM2, the rotation of the magnetization vector $\vec{m}_2$ of the free magnetic layer FM2 out of the plane of the layer generates a large magnetic field, a 'demagnetizing' field, which is perpendicular to the plane of the layer.

This demagnetizing field forces the magnetization vector $\vec{m}_2$ of the free magnetic layer FM2 to precess, i.e., to move such that the magnetization direction rotates about the magnetic field axis. The demagnetizing field also determines the rate of precession. A large demagnetizing field results in an extremely high precession rate, which is an optimal condition for fast magnetic switching.

Thus, in an optimal configuration of the magnetic memory device for fast magnetic switching, the magnetic moment of the pinned magnetic layer FM1 is perpendicular to the plane of the free magnetic layer FM2, and the magnetic moment of the free magnetic layer FM2 is perpendicular to the axis of the pillar of thin layers and lies in the plane of the free magnetic layer FM2.

Figure 2E:
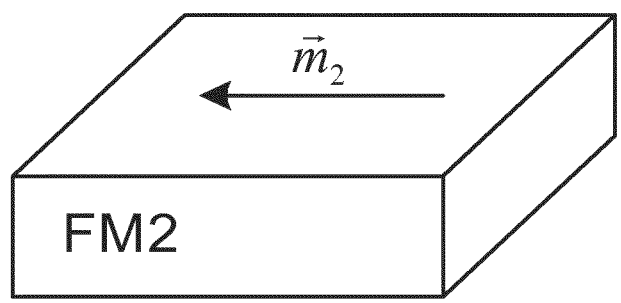

FIG. 2E shows the free magnetic layer FM2 after the magnetic switching process is completed. As shown in FIGS. 2A and 2E, the magnetic switching process causes the magnetization vector $\vec{m}_2$ of the free magnetic layer FM2 to switch by reversing direction by rotating 180°.

FIGS. 3A and 3B show two different forms of current input that may be applied to the magnetic device. The current input shown in FIG. 3A is comprised of two current pulses of short duration, a first positive current pulse followed by a second negative current pulse. This form of current input results in writing a '1' or a '0'. Alternatively, the first current pulse can be negative and the second current pulse can be positive, as long as the two current pulses are of opposite polarity. In both cases, the state of the magnetic bit will be changed from '1' to '0' or '0' to '1' (i.e., the final state will be the complement of the initial state of the bit).

The current input shown in FIG. 3A is used in the method of magnetic switching described above and shown in FIGS. 2A-2E. Using a current input formed of two current pulses results in a faster magnetic switching process.

The first current pulse starts the precession of the magnetization vector $\vec{m}_2$ of the free magnetic layer FM2. After the completion of the first current pulse, the second current pulse is applied to stop the precession at a desired state.

The second current pulse is not essential to the operation of the device, but it enables higher speed switching. For example, the current input shown in FIG. 3B is comprised of a single positive current pulse. Alternatively, a single negative current pulse may also be applied to the magnetic device. Simulations show that many different types of current pulses switch FM2. Therefore device operation is certainly not limited to the current pulses shown in FIG. 3.

Structure of a Memory Cell

Figure 4:
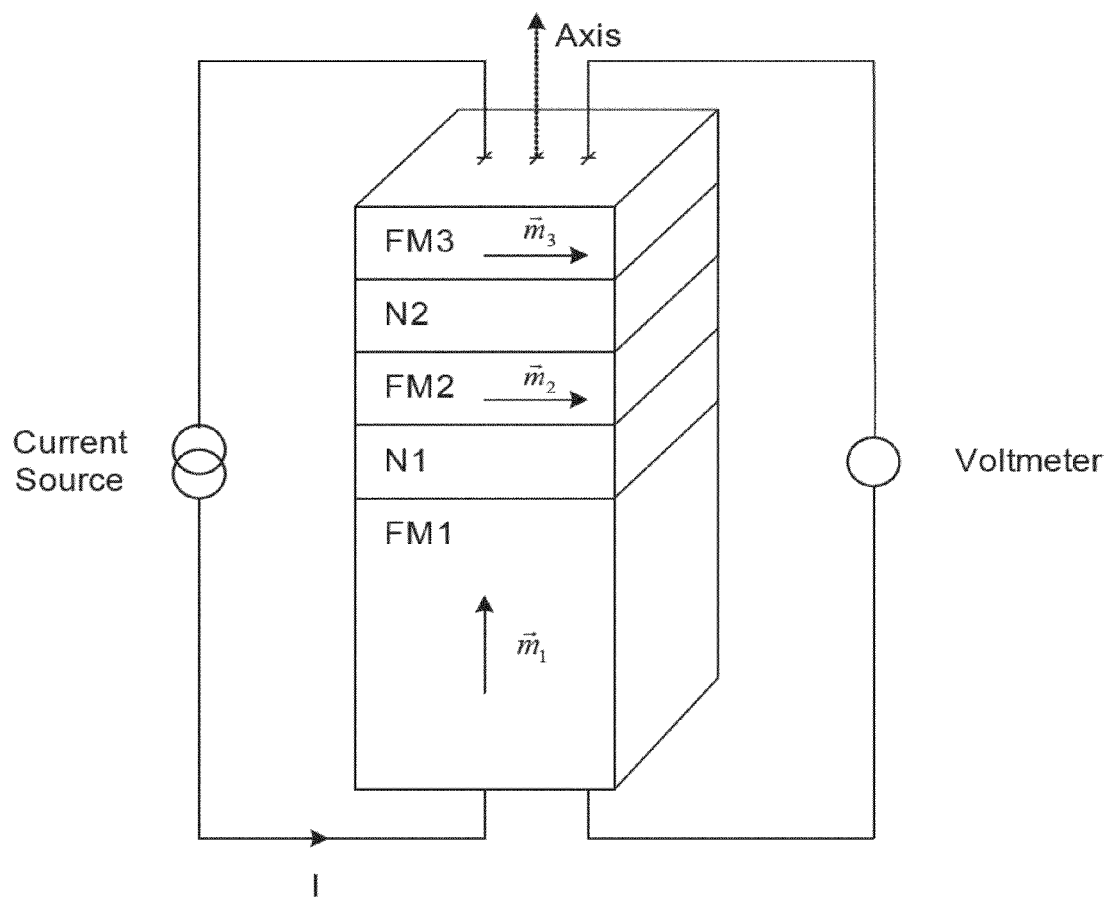
FIG. 4 is an illustration of a memory cell according to one embodiment of the present invention.

The magnetic device described above can be incorporated into a memory cell for inclusion into arrays of memory cells to make up a magnetic memory. According to one embodiment as shown in FIG. 4, the magnetic device of the present invention, when implemented as a memory cell, is a multi-layered, pillar-shaped device having a pinned magnetic layer FM1 with a fixed magnetization direction, a free magnetic layer FM2 with a free magnetization direction, and a read-out magnetic layer FM3 with a fixed magnetization direction. $\vec{m}_1$ is the magnetization vector of the pinned magnetic layer FM1, $\vec{m}_2$ is the magnetization vector of the free magnetic layer FM2, and $\vec{m}_3$ is the magnetization vector of the read-out magnetic layer FM3.

The pinned magnetic layer FM1 and the free magnetic layer FM2 are separated by a first non-magnetic layer N1 that spatially separates the two layers FM1 and FM2 such that their mutual magnetic interaction is minimized. The free magnetic layer FM2 and the read-out magnetic layer FM3 are separated by a second non-magnetic layer N2 that spatially separates the two layers FM2 and FM3 such that their mutual magnetic interaction is minimized. The pillar-shaped magnetic device is typically sized in nanometers, e.g., it may be less than approximately 200 nm.

An electric current source is connected to the pinned magnetic layer FM1 and the read-out magnetic layer FM3 so that an electric current I can traverse the pillar device. A voltmeter is connected to the pinned magnetic layer FM1 and the read-out magnetic layer FM3 so that the resistance of the magnetic device can be measured to thereby read the logical contents of the memory cell.

Method for Writing Information

The magnetic switching process is used when information is written into a memory cell. To store a logical bit of information in a memory cell, the magnetization direction of the magnetization vector inside the memory cell is set in one of two possible orientations to code the logical values of '0' and '1'. This magnetic device, when implemented as a memory cell, uses the method of magnetic switching described previously in order to store bits of information. Current pulses are applied to change the logical value in the magnetic device. The magnetic memory device described above and shown in FIG. 4 stores one bit of information since the free magnetic layer FM2 has a single magnetization vector $\vec{m}_2$ with two stable magnetic states.

An electric current I is applied to the pillar-shaped magnetic memory device so that the current I flows through the various layers of the magnetic memory device, from the pinned magnetic layer FM1 to the read-out magnetic layer FM3. The applied current I results in a transfer of angular momentum from the pinned magnetic layer FM1 to the free magnetic layer FM2.

Figure 5A:
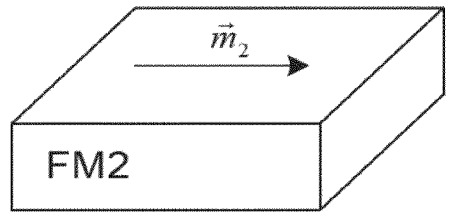
FIGS. 5A-5E are illustrations of the free magnetic layer showing the magnetization vector and the demagnetizing field of the memory cell of FIG. 4.

FIGS. 5A-5E show steps in the method of writing information using the magnetic memory device shown in FIG. 4 and for convenience, FIGS. 5A-5E only show the free magnetic layer FM2 and the magnetization vector $\vec{m}_2$ of the free magnetic layer FM2. FIG. 5A shows the initial state of the free magnetic layer FM2 before the current I is applied.

Figure 5B:
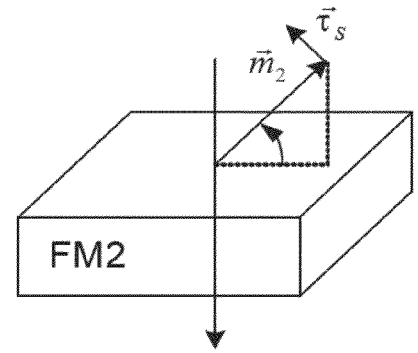
Figure 5C:
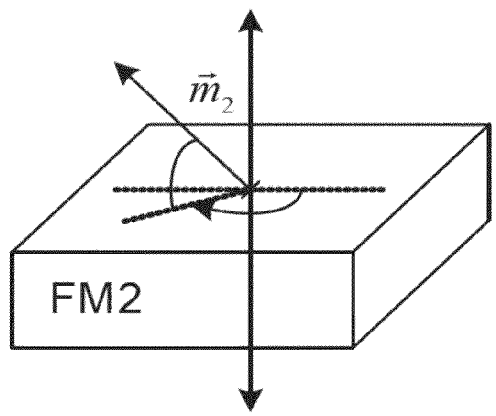
Figure 5D:
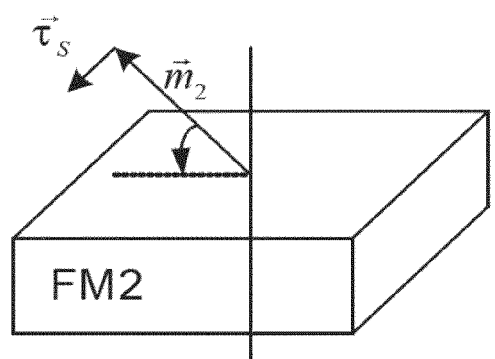

As shown in FIGS. 5B-5D, applying a current I, which can be of a form as shown in FIGS. 3A and 3B, results in the transfer of angular momentum from the pinned magnetic layer FM1 to the free magnetic layer FM2. FIGS. 2A-2E and 5A-5E show the change in the orientation of the magnetization vector $\vec{m}_2$ of the free magnetic layer FM2 as a result of applying the current to the magnetic device.

Figure 6A:
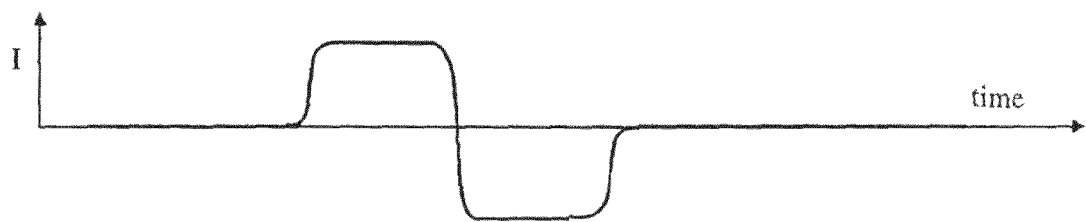
FIG. 6A is an illustration of a current waveform that may be applied to the memory cell of FIG. 4 during a write operation.

FIG. 6A shows a form of the current input that is applied to the magnetic memory device shown in FIG. 4. The current input of FIG. 6A includes two current pulses of short duration, a first positive current pulse followed by a second negative current pulse, which results in writing a '1' or a '0'. Alternatively, the first current pulse can be negative and the second current pulse can be positive, as long as the two current pulses are of opposite polarity. In both cases, the state of the magnetic bit will be changed from '1' to '0' or '0' to '1' (i.e., the final state will be the complement of the initial state of the bit).

The first current pulse starts the precession of the magnetization vector $\vec{m}_2$ of the free magnetic layer FM2. After the completion of the first current pulse, the second current pulse is applied to stop the precession at a desired state. For this embodiment of the magnetic memory device of the present invention, the precession is stopped when 180° rotation of the magnetization vector $\vec{m}_2$ of the free magnetic layer FM2 is achieved.

Figure 5E:
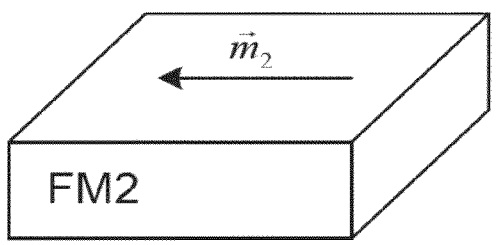
Figure 6B:
FIG. 6B is an illustration of a resistance measured from the memory cell during a read-out operation before and after the current pulse shown in FIG. 6A is applied.

FIG. 6B shows an example of the corresponding resistance of the device as measured by the voltmeter connected to the magnetic memory device shown in FIG. 4 with a small current applied, i.e., a current intensity much less than that used in the current pulses. The resistance increases after the current pulses of FIG. 6A are applied to the device. At the initial state shown in FIG. 5A (before the first positive current pulse), the resistance is at a constant low value. At the final state shown in FIG. 5E, the resistance is at a constant high value.

Thus, the states shown in FIGS. 5A and 5E correspond to a logical value of "0" in the initial state and a logical value of "1" in the final state, respectively. The magnetization vector di, of the free magnetic layer FM2 in the final state shown in FIG. 5E is in the opposite direction than the magnetization vector $\vec{m}_2$ of the free magnetic layer FM2 in the initial state shown in FIG. 5A.

Figure 14A:
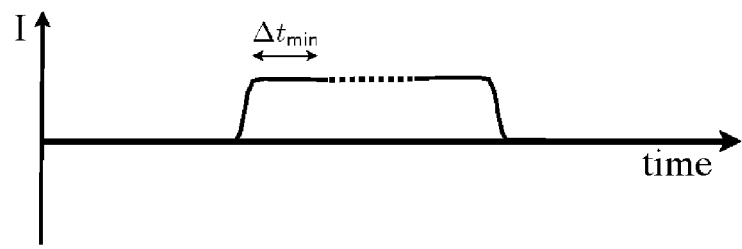
FIGS. 14A-D are illustrations of the response of the resistance of a magnetic device to current pulses of variable length, according to embodiments of the present invention.
Figure 14B:
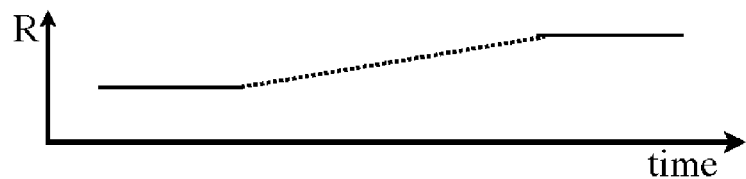
Figure 14C:
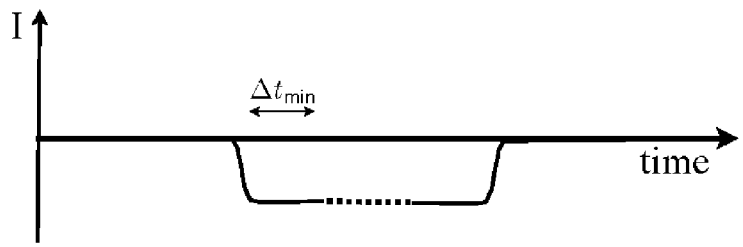
Figure 14D:
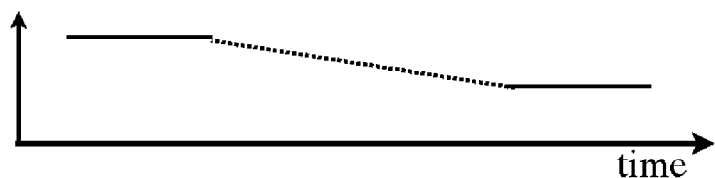

The current pulse that is used to switch the magnetization vector $\vec{m}_2$ of the free magnetic layer FM2 may have a minimum pulse duration that is required in order to switch the magnetization vector $\vec{m}_2$ between stable states. However, there is generally no maximum pulse duration; i.e., a current pulse will switch the state of the magnetization vector $\vec{m}_2$ between stable states so long as it is applied for the minimum pulse duration, regardless of the extent to which the applied pulse duration exceeds the minimum. FIGS. 14A and 14B demonstrate this phenomenon for a pulse of positive polarity. FIG. 14A illustrates a current pulse that is applied for at least as long as the minimum pulse duration for switching, $\Delta t_{min}$, and is then applied for a variable additional length of time represented by the dashed line. FIG. 14B plots the resistance of the device over time in response to the pulse of FIG. 14A. These figures demonstrate that, so long as the pulse is applied for at least $\Delta t_{min}$, the device will switch from its initial, low-resistance stable state to its final, high-resistance stable state, regardless of the length of the additional, variable-length pulse period. FIGS. 14C and 14D demonstrate this phenomenon for a pulse of negative polarity, which switches the device resistance from a high-resistance state to a low-resistance state. A person of ordinary skill in the art would recognize that the absolute polarity of the pulse used to switch the device resistance from high to low or low to high is not important, so long as the pulses used to change the device resistance from high to low and low to high are of opposite polarity. Therefore, a pulse of "positive" absolute polarity could be used to switch the resistance from high to low, while a pulse of "negative" absolute polarity could be used to switch the resistance from low to high.

The necessary amplitude of the current pulses can be estimated by numerical modeling using the equations of micromagnetics, the Landau-Lifzshitz Gilbert equations including the spin-transfer torque discussed earlier (see, for example, B. Oezyilmaz et al., Phys. Rev. Lett. 91, 067203 (2003)). For a free layer comprised of Co with a magnetization density of M=1400 emu/cm$^3$, a Gilbert damping parameter $\alpha$ of 0.01, a spin-polarization of the current P of 0.4, and an in-plane uniaxial anisotropy field of 1000 kOe. (In this case, the in-plane uniaxial anisotropy constant K is $K=7\times10^5$ erg/cm$^3$.) For the purposes of this estimation, the Co free layer is 3 nm thick and has lateral dimensions of 60 nm by 60 nm. We find that a current pulse of amplitude of 5 mA is more than sufficient to switch the layer. The current necessary to switch the device is reduced by decreasing the size of the Co free layer; increasing the spin-polarization of the current, for example, by using a pinned layer with a higher degree of spin-polarization; and decreasing the in-plane anisotropy or decreasing the Gilbert damping. For this current amplitude, a 35 psec pulse is sufficient to switch the device.

With a device resistance of 5 Ohms, the energy dissipation is $5\times10^{-15}$ J. This energy dissipation value can be compared to the energy needed to switch a magnetic device with a spin-polarized current when the pinned layer and the free layer magnetizations are initially aligned along the same axis. Recent experiments show that this requires a current of approximately 10 mA applied for approximately 10 ns in a device with a resistance of 5 Ohms (see, R. H. Koch et al. Phys. Rev. Lett. 92, 088302 (2004)). The energy dissipated is thus $5\times10^{12}$ J. Thus, in comparison, the power requirement for our device is quite small. Further, because the pulse is on only very briefly, in spite of the large current densities, 1 A/$\mu$m$^2$, no electromigration is expected. Further, we have operated such devices at current densities 5 times greater than this value for extended periods (approximately 1 minute) with no device damage (see, B. Oezyilmaz et al., Phys. Rev. Lett. 91, 067203 (2003)).

Method for Reading Information

The read-out magnetic layer FM3 is required in the simplest implementation of the magnetic memory device. The read-out magnetic layer FM3 has a magnetization vector $\vec{m}_3$ with a fixed magnetization direction. The magnetization vector $\vec{m}_3$ of the read-out magnetic layer FM3 can be fixed in a number of ways. For example, the read-out magnetic layer FM3 can be formed thicker or of a higher anisotropic magnetic material or can be placed adjacent to an antiferromagnetic layer to use the phenomena of exchange biasing. In the phenomena of exchange biasing, the coupling between the antiferromagnetic layer and the ferromagnetic layer and the large magnetic anisotropy of the antiferromagnetic layer results in a hardening of the ferromagnetic layer so that larger magnetic fields and currents are required to change its magnetization direction.

The resistance of the magnetic memory device is very sensitive to the relative orientation of the magnetization vector $\vec{m}_2$ of the free magnetic layer FM2 and the magnetization vector $\vec{m}_3$ of read-out magnetic layer FM3. The resistance of the magnetic memory device is highest when the magnetization vectors $\vec{m}_2$ and $\vec{m}_3$ of the free magnetic layer FM2 and the read-out layer FM3, respectively, are in anti-parallel alignment. The resistance of the magnetic device is lowest when the magnetization vectors $\vec{m}_2$ and $\vec{m}_3$ of the layers FM2 and FM3, respectively, are in parallel alignment. Thus, a simple resistance measurement can determine the orientation of the magnetization vector $\vec{m}_2$ of the free magnetic layer FM2.

The fixed orientation of the magnetization vector $\vec{m}_3$ of the read-out magnetic layer FM3 is set so that it is either in parallel or anti-parallel alignment with the magnetization vector $\vec{m}_2$ of the free magnetic layer FM2, depending on the orientation of the magnetization vector $\vec{m}_2$ of the free magnetic layer FM2. Since the orientation of the magnetization vector $\vec{m}_2$ of the free magnetic layer FM2 switches so that it can be rotated 180°, the magnetization vectors $\vec{m}_2$ and $\vec{m}_3$ of the free magnetic layer FM2 and the read-out layer FM3, respectively, must be in either anti-parallel or parallel alignment.

Storage of Multiple Bits of Information

Figure 7:
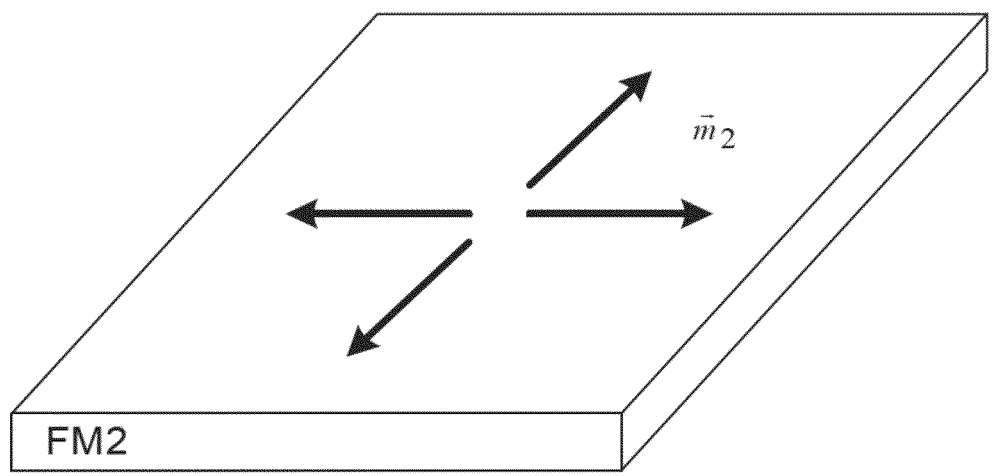
FIG. 7 is an illustration of the free magnetic layer of a 4-state memory cell.

The magnetic memory device described above and shown in FIG. 4 has two stable magnetic states and is able to store one bit of information. According to another embodiment of the present invention, a magnetic memory device can be constructed to store multiple bits of information. FIG. 7 shows an example of a free magnetic layer FM2 with four stable magnetic states. A magnetic memory device comprising a free magnetic layer FM2 with four stable magnetic states is able to store two bits of information. In this embodiment, current pulses are applied to switch the magnetization between directions that differ by 90° instead of 180°. This can be accomplished by current pulses of a different form. For example, the current pulses can be smaller in amplitude and/or shorter in duration. The readout layer (FM3) is then aligned such that each of the four magnetization states has a different resistance. This requires that the readout layer magnetization not have an in-plane component that points parallel to any of the four states nor at 45° to these states.

Example

The operation of the magnetic device was simulated using Landau-Lifzshitz Gilbert equations including a spin-transfer torque.

Figure 8:
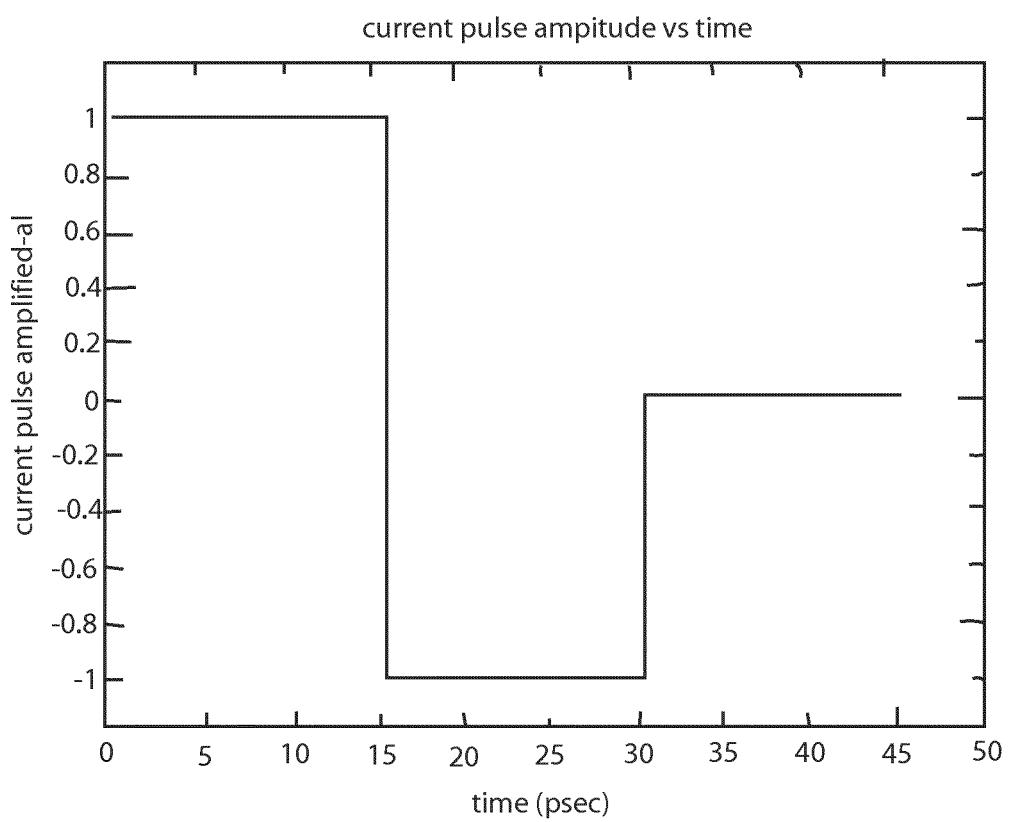
FIG. 8 is an illustration of an example of a current waveform applied to the magnetic device.

FIG. 8 shows the amplitude of the current input applied to the magnetic memory device starting at an initial time t=0 and ending at t=30 picoseconds. This current input comprises two current pulses similar to the current input shown in FIGS. 3A and 6A.

A 16-picosecond positive current pulse is applied to the magnetic memory device to start the precession of the magnetization vector $\vec{m}_2$ of the free magnetic layer FM2. After this 16-picosecond current pulse, a 14-picosecond negative current pulse is applied to the magnetic memory device to stop the precession of the magnetization vector $\vec{m}_2$ of the free magnetic layer FM2 to achieve a desired state of the magnetization vector $\vec{m}_2$. For magnetic memory devices, the precession is stopped after achieving a 180° rotation of the magnetization vector $\vec{m}_2$ of the free magnetic layer FM2.

Figure 9:
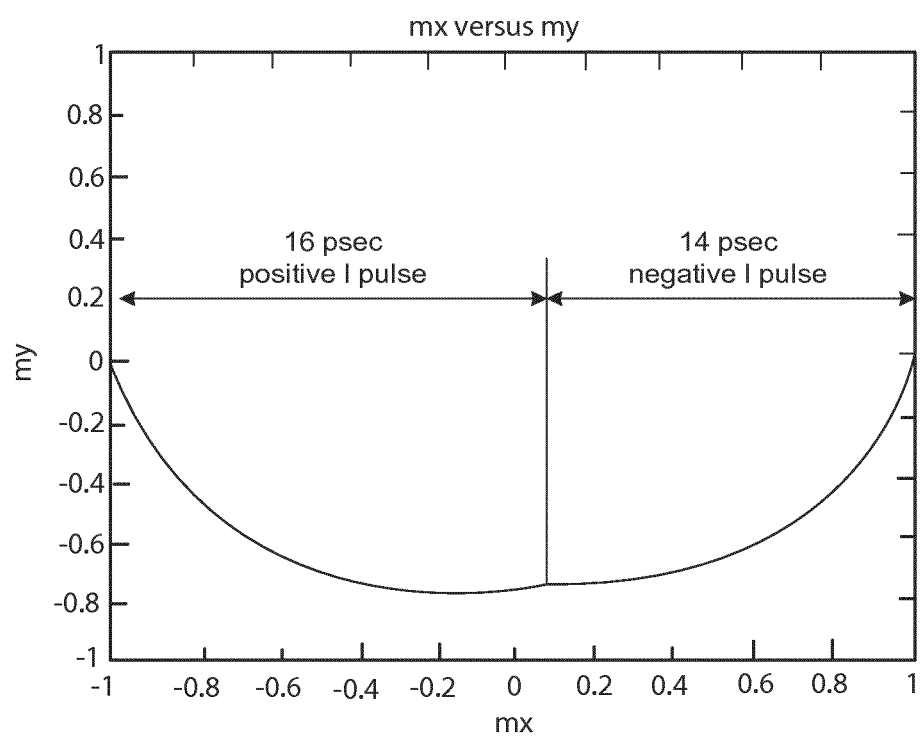
FIG. 9 is an illustration of the magnetization components of the free magnetic layer during and after the application of the current pulse shown in FIG. 8.

FIG. 9 shows the magnetization components $\vec{m}_X$ and $\vec{m}_Y$ of the magnetization vector $\vec{m}_2$ of the free magnetic layer FM2 in the x- and y-directions shown in FIGS. 2B and 5B. The magnetization components $\vec{m}_X$ and $\vec{m}_Y$ are measured during and after the application of the current input shown in FIG. 8. FIG. 9 shows that the magnetization vector $\vec{m}_2$ of the free magnetic layer FM2 reverses 180° from the initial state, which corresponds to FIG. 5A, to the final state, which corresponds to FIG. 5E. The magnetization components ($\vec{m}_X$, $\vec{m}_Y$) are able to switch between (−1,0) to (1,0) as shown by the present invention.

Advantages

The high speed, low power magnetic device of the present invention uses energy only for read and write operations or logic operations. When not energized, the information is stored without significant loss. Thus, the magnetic device of the present invention, when implemented as a memory cell, can be used as a non-volatile memory.

The non-volatile memory provided by the magnetic device of the present invention is suitable for many applications, such as in computers and portable electronic devices. In particular, the high speed, low power magnetic device of the present invention provides several advantages. The performance of the high speed, low power magnetic device of the present invention compares favorably with flash memory and other types of non-volatile random access memory (RAM), such as conventional magnetic RAM (MRAM) and ferroelectric RAM (FRAM).

The current-induced torques act only on the magnetic device that is energized, i.e., to which a current is applied. Therefore, when multiple magnetic devices are arranged in an array, such as in magnetic memory, the current-induced spin transfer does not produce parasitic interactions ("crosstalk") between the neighboring elements in the array, unlike in conventional magnetic memories in which magnetic switching is accomplished by using magnetic fields produced by small current-carrying wires near the magnetic elements.

The method of magnetic switching by current induced torque provided by the present invention is faster than current conventional methods that use magnetic fields to switch the magnetization direction of layers. Read-out and write operations of the present invention can be completed in sub-nanosecond time scales. Conventional magnetic hard drives are very slow compared to the magnetic memory of the present invention since the conventional hard drives have data access times of the order of milliseconds.

The method of magnetic switching by current induced torque provided by the present invention requires low power. This is especially advantageous for use in portable electronic devices.

The method of magnetic switching by current induced torque provided by the present invention is ideal for sub-micron scale devices since the lateral dimension of the magnetic device of the present invention may be less than approximately 200 nm. Therefore, the present invention is scaled to allow the fabrication of ultra-high density memory cells so that a vast amount of information can be stored in the magnetic memory provided by the present invention.

The basic architecture of the high speed, low power magnetic device of the present invention is straightforward, and read-out and write operations are reliable and are less sensitive to changes in temperature. Unlike conventional magnetic memory devices, the present invention does not rely on stochastic (random) processes or fluctuating fields to initiate switching events.

According to one embodiment of the present invention, multiple bits of information can be stored on each device so that even more information can be stored in the magnetic memory.

The method of magnetic switching by current induced torque provided by the present invention can be used for logic operations, as well as for magnetic memory devices. Since there is a threshold, which is dependent on the shape, amplitude, and period of the current pulse, for the current pulse to produce a change in magnetization, current input can be combined to produce a logic function, such as an AND gate. For example, two current pulses can be combined to produce a current pulse that traverses the device which is the sum of the two current pulses. The pulse characteristics (shape, amplitude, and period) can be chosen such that each pulse individually does not switch the device, yet the combined pulse does switch the device. Thus, this is an AND operation. A NOT operation requires simply switching the state of the device. A NOT and an AND operation can be combined to produce a NAND function, which is a universal digital logic gate (i.e., all digital logic functions can be constructed from NAND gates.)

Figure 10:
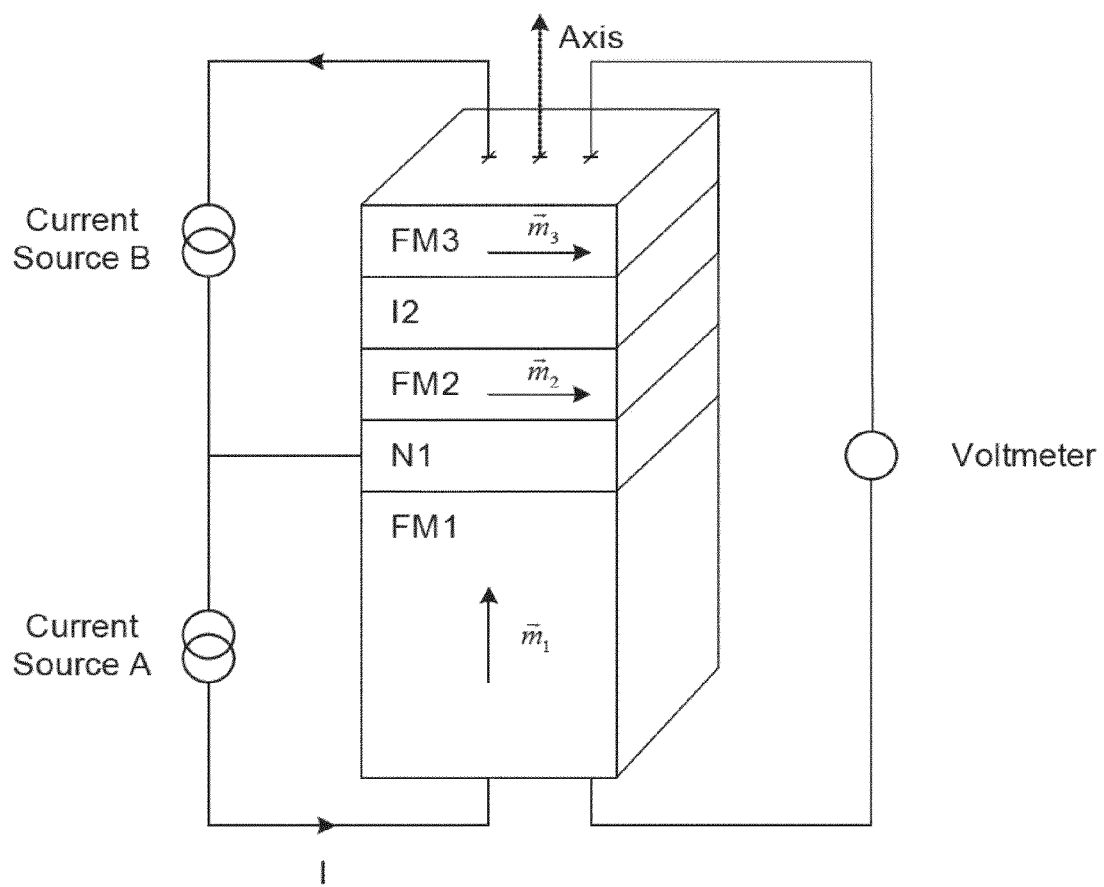
FIG. 10 is an illustration of a memory cell according to one embodiment of the present invention in which during writing operations no net current passes through the free magnetic layer.

There are several possible geometries and layer configurations that are provided by the present invention. For example, an embodiment of the magnetic device of the present invention may be configured so that no net current passes through the free magnetic layer FM2 during write operations. This is illustrated in FIG. 10 which shows an embodiment of the present invention including current source A, current source B, and layer I2, which is a thin insulating layer made of Al$_2$O$_3$, for example. In this device, layer I2 is 0.5 to 3 nm thick and is thin enough so that electrons can traverse the layer by quantum mechanical tunneling.

In the device shown in FIG. 10, current pulses are applied with current source A to change the magnetization direction of the free magnetic layer FM2. Using current source A, current flows from FM1 to the non-magnetic layer N1 and electron spin angular momentum is transferred to the free magnetic layer FM2 by reflection of electrons at the interface between the non-magnetic layer N1 and the free magnetic layer FM2. The device readout is performed using current source B. The voltage is measured when a small current from B passes between the free magnetic layer FM2 and the readout layer FM3. This voltage will depend on the relative magnetization directions of the layers FM2 and FM3 so that the magnetization direction of the free magnetic layer FM2 can be determined to read-out the device. This device has the advantage that the readout signal is large since the tunnel junction resistance can be large (1 Ohm to 100 kOhm). Readout signals can be in the range from 10 mV to 1 V.

Figure 16:
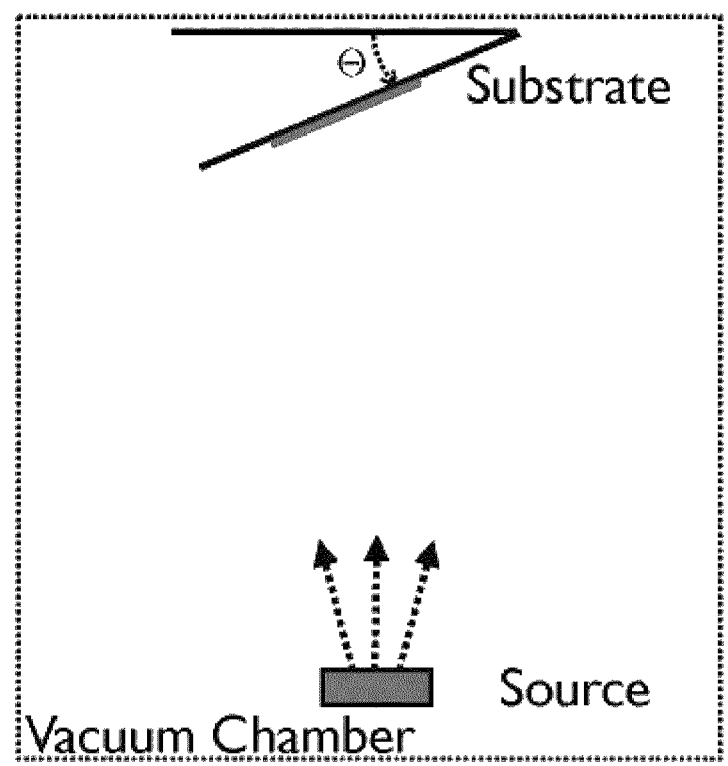
FIG. 16 is an illustration of a method of making a magnetic layer having a magnetization oriented at a substantially non-zero angle relative to the layer normal.

Method of Making Thin Films of High Magnetic Anisotropy Material Magnetized at Substantially Non-Zero Angles Relative to the Film Normal A method of making thin films of high magnetic anisotropy material with magnetizations oriented at substantially non-zero angles relative to the film normal is illustrated in FIG. 16. In FIG. 16, a deposition source and a substrate are provided in a vacuum chamber. The deposition source emits high magnetic anisotropy materials that travel to the substrate at a substantially non-zero angle θ relative to the normal of the plane of the substrate. The deposition source may be an evaporation source, a sputtering source, or any other source suitable for depositing high magnetic anisotropy materials on the substrate. Applicants' experimentation has revealed that the magnetization direction of the resulting thin films can be controlled by varying the angle θ between the direction of deposition and the normal to the plane of the substrate.

The surface of the substrate is provided with a seed layer. The seed layer may include transition metals, such as Ta, Pt, Ti, Cu or Ru, either alone or in combination. One purpose of the seed layer is to give a preferred crystalline orientation for the films that are deposited on the substrate. Thus, the resulting films may be polycrystalline, and may have a preferred crystalline orientation. The substrate need not be crystallographically matched to the deposited films. Thus, a large variety of materials may be used for the substrate, such as Si, glass, GaAs, SiN, MgO, sapphire or diamond.

In some embodiments, the deposition source provides multilayers of high magnetic anisotropy materials to the seed layer of the substrate. In an embodiment, the individual material layers that make up the multilayers may each have thicknesses in the range of 0.1 to 1.5 nm, and the total multilayer thickness may be in the range of 2 to 15 nm, although other thicknesses may also be used. Many classes of high magnetic anisotropy materials may be used, such as multilayers of Ni/Co, Pt/Co/Ni, or Pd/Co/Ni. Another material that may be used is the $L1_0$ phase of FePt, which has one of the highest magnetic anisotropies among all currently-known materials. Magnetic layers of FePt may be constructed with diameters as small as 3 nm while remaining thermally stable at room temperature, making such layers ideally suited for use in very high density data storage applications. Other materials that may be used include, but are not limited to, multilayers of Fe and Pd, Co and Pt, or Co and Pd.

In one illustrative embodiment, the structure of the thin films is: substrate/Ta (3 nm)/Pt (3 nm)/[Co (0.1 nm)/Ni (0.6 nm)]×5/Pt (3 nm). In this embodiment, the seed layer is the 3 nm layer of Ta. The magnetic layer with high magnetic anisotropy is the Co/Ni layer, which is repeated 5 times. The Co/Ni layers are surrounded by two 3 nm layers of Pt. As discussed above, the magnetization direction of such an embodiment can be selected by varying the angle between the direction of deposition and the normal to the plane of the substrate.

Magnetic Devices Including Layers with Magnetizations Oriented at Substantially Non-Zero Angles Relative to the Layer Normal In some embodiments of the present invention, a magnetic layer with a magnetization oriented at a substantially non-zero angle relative to the layer normal is incorporated into a magnetic device configured for spin transfer switching. The magnetic layer with a magnetization oriented at a substantially non-zero angle relative to the layer normal may be constructed by deposition of thin films of high magnetic anisotropy materials at an angle to a substrate, as discussed above. However, this magnetic layer may also be constructed by other means.

In some embodiments, the magnetic device includes both free and pinned magnetic layers, one of which has a magnetization oriented at a substantially non-zero angle relative to the layer normal. The free layer may have a thickness in the range of 2 to 5 nm, and the pinned layer may have a thickness in the range of 8 to 15 nm, although other thicknesses may also be used. The free and pinned layers may be separated by an insulating layer that is sufficiently thin to allow electrons to traverse the layer by quantum mechanical tunneling, or by a nonmagnetic conductor. In the former case, the device is a magnetic tunnel junction (MTJ) device, and the device resistance is determined by the tunnel magnetoresistance effect (TMR). In the latter case, the device is a giant magnetoresistance (GMR) device. Application of a current pulse of sufficient amplitude and duration causes the magnetization of the free layer to switch between stable states, thereby changing the resistance of the magnetic device. The largest change in resistance occurs when the magnetization of the free layer is switched between parallel and antiparallel arrangements. However, even if the magnetization of the free layer does not switch between parallel and antiparallel arrangements, the change in resistance can still be very large provided that there is a large change in the projection of the magnetization of the free layer on the magnetization of the pinned layer. Therefore, magnetic devices in which the magnetization of the free layer switches between states that are not parallel and antiparallel can still have large readout signals. Consequently, such devices are well-suited for use as magnetic memory devices.

Figure 15A:
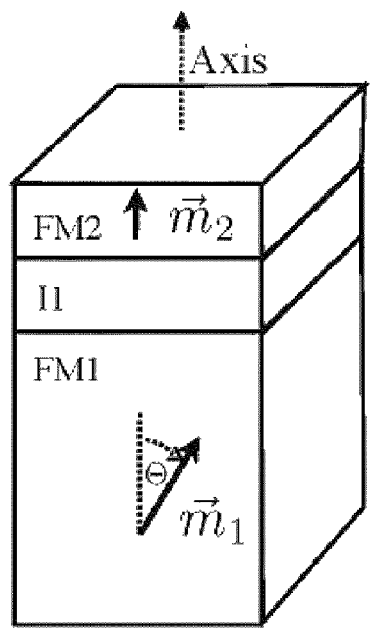
FIGS. 15A-D are illustrations of magnetic devices having either pinned or free layer magnetizations oriented at substantially non-zero angles relative to the layer normal.
Figure 15B:
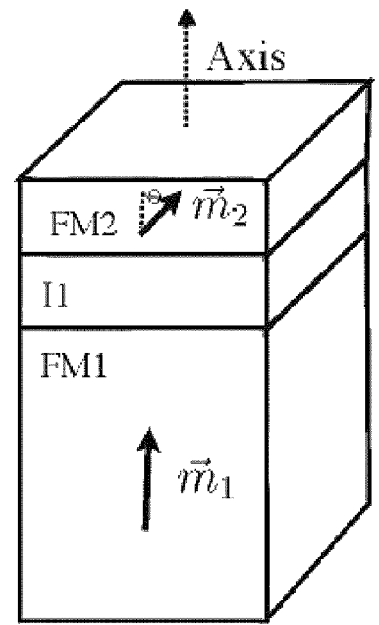
Figure 15C:
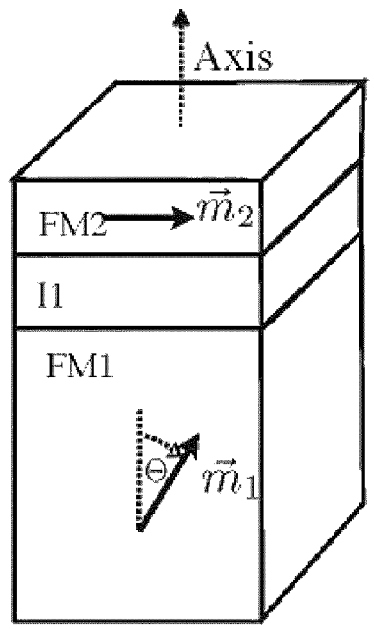
Figure 15D:
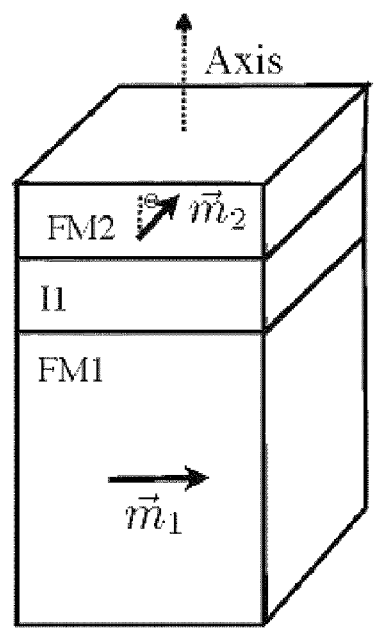

FIGS. 15A-15D illustrate embodiments of magnetic devices in which either the pinned or free layer has a magnetization oriented at a substantially non-zero angle relative to the layer normal. In all of FIGS. 15A-15D, the nonmagnetic layer I1 between the pinned layer FM1 and the free layer FM2 may be either an insulator or a nonmagnetic conductor. FIG. 15A illustrates an embodiment of a magnetic device in which the magnetization $\vec{m}_1$ of the pinned magnetic layer FM1 is oriented at a substantially non-zero angle relative to the normal of the pinned layer, while the magnetization of the free magnetic layer FM2 is, in a stable state, parallel to the normal of the free layer. FIG. 15B illustrates an embodiment of a magnetic device in which the magnetization $\vec{m}_2$ of the free magnetic layer FM2 is, in a stable state, oriented at a substantially non-zero angle relative to the normal of the free layer, while the magnetization $\vec{m}_1$ of the pinned layer is parallel to the normal of the pinned layer. FIG. 15C illustrates an embodiment of a magnetic device in which the magnetization $\vec{m}_1$ of the pinned magnetic layer FM1 is oriented at a substantially non-zero angle relative to the normal of the pinned layer, while the magnetization $\vec{m}_2$ of the free magnetic layer is, in a stable state, in the plane of the free layer. FIG. 15D illustrates an embodiment of a magnetic device in which the magnetization $\vec{m}_2$ of the free magnetic layer FM2 is, in a stable state, oriented at a substantially non-zero angle relative to the normal of the free layer, while the magnetization $\vec{m}_1$ of the pinned layer is in the plane of the pinned layer.

Structure of an Annular Magnetic Device

Figure 11:
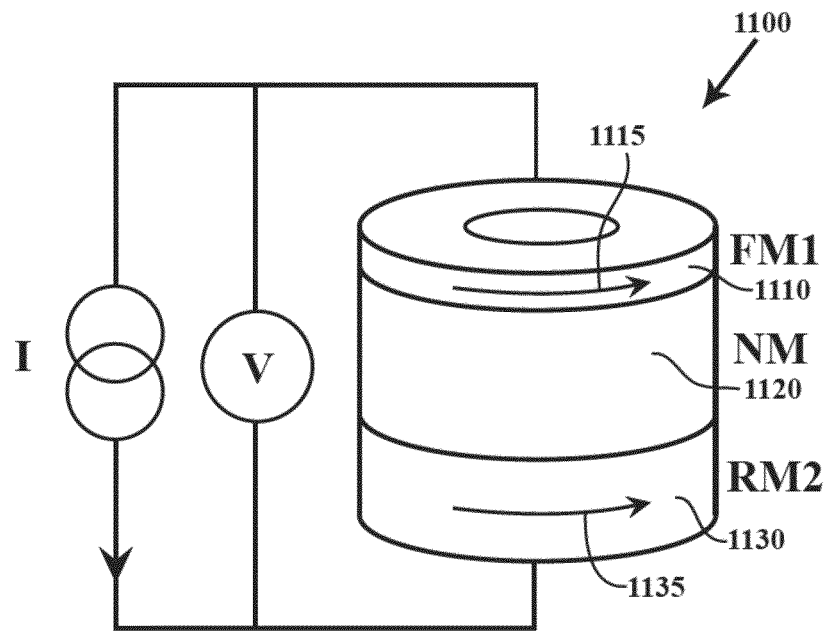
FIG. 11 is an illustration of an annular magnetic device according to the present invention.

A pillar-shaped magnetic device 1100 having a closed periodic structure is illustrated in FIG. 11. Magnetic device 1100 includes a free magnetic layer 1110, a non-magnetic layer 1120, and a reference magnetic layer 1130. The reference layer 1130 preferably has a fixed magnetic helicity 1135, a magnetic vector with a fixed direction at a predetermined angle, for example, perpendicular to the plane of the layer, or both a fixed magnetic helicity 1135 and a magnetic vector having a fixed direction at a predetermined angle. The free magnetic layer 1110 preferably has a free magnetization helicity 1115. The reference layer 1130 preferably acts as a source of spin angular momentum. The free layer 1110 and the reference layer 1130 are preferably separated by non-magnetic layer 1120.

The reference layer 1130 is preferably magnetically harder than the free layer 1110 and preferably has a well-defined magnetic state. This property can be achieved, for example, by using a layer that is thicker than the free layer or a material having a larger magnetic anisotropy than the material of the free layer 1110, such as Cobalt, the L10 phase of FePt or FePd, or layered structures of Cobalt and Nickel. Alternatively, the desired hardness can be achieved through exchange coupling to a thin anti-ferromagnetic layer, such as IrMn or FeMn.

The non-magnetic layer 1120 preferably conserves spin-momentum of the reference magnetic layer 1130 during spin transport across the non-magnetic layer 1120. Thus, the spin diffusion length of the material used in the non-magnetic layer 1120 is preferably longer than the thickness of the non-magnetic layer 1120. Examples of materials that satisfy the desired properties include any of the noble metals (e.g., Cu, Ag, Au). The non-magnetic layer may also be an insulator such as $Al_2O_3$ or MgO. For a sufficiently thin insulating layer the spin transport will occur by electron tunneling so as to form a magnetic tunnel junction.

The free magnetic layer 1110 preferably includes a soft magnetic material having a large exchange length, such as permalloy, cobalt, nickel, iron, boron and alloys of those materials. Additionally, alloys including non-magnetic elements, such as copper, may advantageously reduce the magnetic moment of the layers. Alternatively the free magnetic layer can include magnetic oxides such as $CrO_2$ or $Fe_3O_4$.

As illustrated in FIG. 11, each layer of the magnetic device 1100 is preferably ring-shaped (i.e. annular). An annular shape can minimize the number of edges or sharp corners that may act as magnetic nucleation sites which reduces stability by increasing the rate of reversal of magnetic helicity. A symmetrical ring structure is one of the preferred shapes which can be used to avoid unwanted reversal of helicity, however the present invention may employ many various forms of closed period structures which may provide similar advantages. The lower the rotational symmetry of the shape of the device, the more likely it is that certain regions will be favored for magnetic nucleation and reversal of magnetic helicity. Geometries that include sharp corners provide strong nucleation sites that encourage helicity reversal and are preferably avoided.

Typically devices that are known in the art result in a tradeoff between the stability of the stored information represented by the free magnetic layer helicity 1115 and the speed and power requirements of changing the information. Typically, as the stability of the programmed helicity increases, so does the power required to change the helicity.

Ring geometries may provide very stable magnetization orientations, with magnetization stability for periods greater than 10 years being achievable. Additionally, the magnetization reversal mechanism of ring geometries may be weakly dependent on ring diameter beyond a critically small size (e.g., typically tens of nanometers). Thus, the size of the device may not be a critical a factor when compared with most presently used geometries. Thus, ring geometries may enable a greater range of use and decreased production costs.

Several factors play a role in the stability of the magnetization of a ring. One factor may be the size of the ring. For a given magnetic field, there exists a critical ring radius for which a ring having a radius equal to or greater than the critical size, the stability of the magnetization of the ring is relatively independent of the ring size. The stability of the magnetization may decrease rapidly as the size of the ring decreases below the critical size. Additionally, the magnetization may be susceptible to thermal fluctuations and the application of a destabilizing magnetic field.

In the limit of low noise, the rate $\Gamma$ of thermally-induced transitions between two stable helical magnetic states in an annular magnetic device is given by the Arrhenius formula:

$$\Gamma \sim \Gamma_0 \exp(-U/k_B T) \quad (1)$$

where U is the energy barrier to transition, $k_B$ is Boltzmann's constant, T is the temperature, and $\Gamma_0$ is a rate prefactor on the order of inverse ferromagnetic resonance frequency ($\sim 10^{-9}$ s), as calculated in K. Martens, D. L. Stein and A. D. Kent, "Magnetic reversal in nanoscopic ferromagnetic rings," Physical Review B, vol. 73, no. 5, p. 054413 (2006) (hereinafter "Martens"). In order to minimize undesired thermally-induced reversal, such that $1/\Gamma \gg 10$ years, an energy barrier of $U > 60 k_B T$ is desirable.

In Martens, the energy barrier U was calculated as a function of material parameters, ring dimensions and the applied circumferential magnetic field. Key parameters are the normalized magnetic field h and the ring size l:

$$h = \frac{H_e}{H_c} = \frac{H_e}{\frac{M_0}{\pi}\left(\frac{t}{\Delta R}\right)\left|\ln\left(\frac{t}{R}\right)\right|} \quad (2)$$

$$l = \frac{R}{\lambda}\sqrt{2\pi\left(\frac{t}{\Delta R}\right)\left|\ln\left(\frac{t}{R}\right)\right|} \quad (3)$$

Here, M0 is the saturation magnetization, t is the ring thickness, $\Delta R$ is the ring width, R is the average radius, $\lambda$ is the exchange length, He is the external magnetic field, and Hc is the field at which the metastable state becomes unstable. The exchange length $\lambda$ is given by $\lambda = \sqrt{2A/(\mu_0 M_0^2)}$, where A is the exchange constant. l represents the ratio of the ring size to the width of a Bloch wall. The critical radius, i.e. the radius below which the stability of the magnetization may rapidly decrease, is the radius for which $l \approx 2\pi$. Setting $l \approx 2\pi$ in Equation 3, the critical radius is given by the solutions to:

$$2\pi \approx \frac{R}{\lambda}\sqrt{2\pi\left(\frac{t}{\Delta R}\right)\left|\ln\left(\frac{t}{R}\right)\right|} \quad (4)$$

The critical radius is approximately the optimal ring radius for spin-torque transfer operation because it achieves an approximately optimal balance between a small ring size and a high magnetization stability.

Figure 17A:
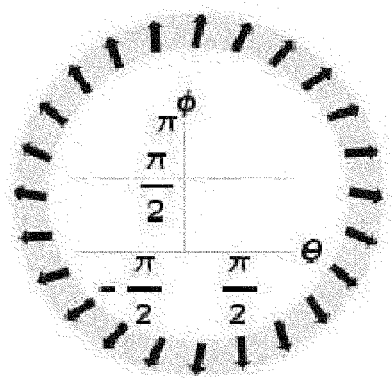
FIG. 17A is an illustration of the magnetization direction of an annular magnetic device having a constant saddle configuration.
Figure 17B:
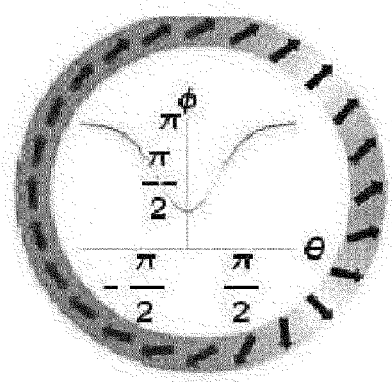
FIGS. 17B-C are illustrations of the magnetization directions of annular magnetic devices having instanton saddle configurations.
Figure 17C:
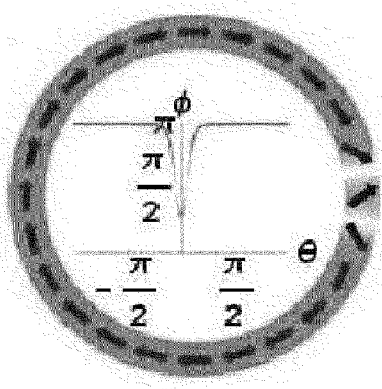

For $l \leq 2\pi\sqrt{1-h^2}$, the theory predicts a constant saddle, as illustrated in FIG. 17A, which depicts a constant saddle configuration for h=0.2. By contrast, for $l > 2\pi\sqrt{1-h^2}$, the theory predicts an instanton saddle, as shown in FIG. 17B, which depicts an instanton saddle configuration for l=12, and FIG. 17C, which depicts an instanton saddle configuration for l=60. Both of these saddle configurations are described by a function $\phi_{h,l}(\theta)$, as set forth in detail in Martens.

The scale of the energy barrier U is given by:

$$E_0 = \frac{\mu_0 M_0^2}{\pi} \frac{\Delta R}{R} lt\lambda^2 \qquad (5)$$

For the constant saddle arrangement, the theory provides that the energy barrier U is given by:

$$U = E_0(1-h)^2 l/2 = \mu_0 M_0^2 t^2 R |\ln(t/R)| (1-h)^2 \qquad (6)$$

This expression is independent of the exchange length $\lambda$ because the transition state has a magnetization at a constant angle to the ring circumference, as depicted in FIG. 17A.

For instant on saddle arrangements, the result is generally more complicated (see Eq. 13 of Martens). However, in the limit $l \gg 2\pi$, the energy barrier for instanton arrangements is:

$$U = 4E_0(\sqrt{1-h} - h\,\text{sec}^{-1}\sqrt{h}) \qquad (7)$$

This can easily reach values greater than $60k_BT$ at room temperature for rings fashioned from, among other materials, permalloy or CoFeB. By way of example, a permalloy ring (A=$1.3\times10^{11}$ J/m, $M_0$=$8\times10^5$ A/m), with R=50 nm, $\Delta R$=20 nm and t=2 nm is in the large-l, instanton limit (l=12.6), and has an energy barrier of U=$80k_BT$ at room temperature with h=0. Therefore, such a ring would be stable against thermal fluctuations for at least 10 years, as discussed above. Rings with even larger ring sizes l have even greater energy barriers to reversal and are therefore easily capable of stable, long-term data retention.

Figure 18:
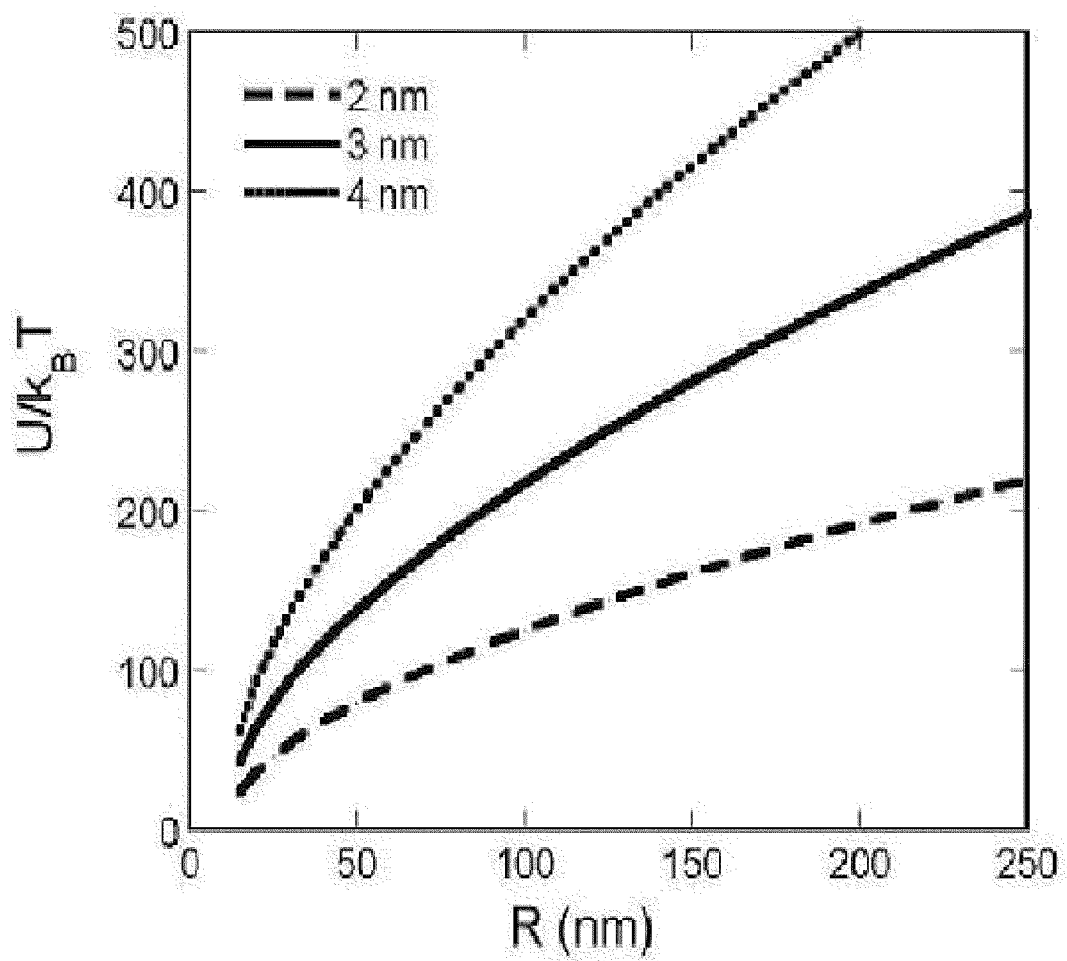
FIG. 18 is an illustration of the energy barrier to magnetization reversal of an annular magnetic device as a function of ring radius for various ring thicknesses.

FIG. 18 shows the dependence of the energy barrier U on ring radius for various ring thicknesses, in a situation with zero applied magnetic field (i.e., h=0). In the plot, the dashed curve represents a ring with thickness t=2 nm, the solid curve represents a ring with thickness t=3 nm, and the dotted curve represents a ring with thickness t=4 nm. The plot assumes a ring width of $\Delta R$=0.4R and a temperature of 300 K; the energy barrier U is plotted in units of $k_BT$. FIG. 18 shows that the energy barrier to reversal, and therefore the magnetization stability, increases with both ring thickness and ring radius.

Utilizing these properties, a ring-shaped magnetic device can be designed for which the magnetization of the device is generally stable under static operating conditions, but can easily be changed or reversed by applying a current pulse to the device. Specifically, for a ring device that is substantially near the critical size with no applied current, the magnetic helicity can be easily reversed by applying an electrical current. The electrical current has the effect of providing a destabilizing field and effectively changing the value of the critical radius of the ring. Thus, a magnetic ring designed near the critical size is stable and does not experience unwanted reversal under normal operating conditions, but can be reversed by the application of a relatively small current.

Neglecting the Oersted field (i.e. setting h=0), the current $I_T$ that is required to switch the magnetization direction can be estimated as:

$$I_T = \frac{e\alpha E_0 l}{\hbar P}(d+1) \qquad (8)$$

where e is the fundamental charge, $\alpha$ is the Gilbert damping constant, $\hbar$ is the reduced Planck's constant, and P is the spin polarization of the applied current. Furthermore, d is the ratio of the out-of-plane anisotropy to the in-plane anisotropy of the ring, given by:

$$d = \frac{2\pi^2 R^2}{l^2 \lambda^2} \qquad (9)$$

which is typically much larger than 1. For example, a permalloy ring with R=50 nm, $\Delta R$=20 nm and t=2 nm has d=10.

By way of example, a permalloy ring with the above characteristics (R=50 nm, $\Delta R$=20 nm and t=2 nm) and also with $\alpha$=0.01 and P=0.4 has a switching current threshold of $I_T$=440 µm and a current density threshold of $J_T$=$6\times10^6$ A/cm$^2$. This current produces a circular Oersted field of $H_e$=1350 A/m, corresponding to h=0.02. Therefore, the Oersted field is, in fact, negligible in this example, and the spin-torque interaction is much more effective than the Oersted field at switching the magnetization direction.

The performance of spin-transfer devices can be evaluated by considering a figure of merit $\epsilon$ defined as the ratio of the threshold current to the energy barrier for reversal of the magnetization direction:

$$\epsilon = I_T/U \qquad (10)$$

Smaller values of the figure of merit $\epsilon$ indicate better device performance because a small value of $\epsilon$ suggests a relatively high value of U, and thus relatively high stability, and/or a relatively low value of $I_T$, and thus relatively low power consumption. Reducing the damping and/or increasing the spin polarization leads to lower current thresholds and more energy efficient devices.

Figure 19:
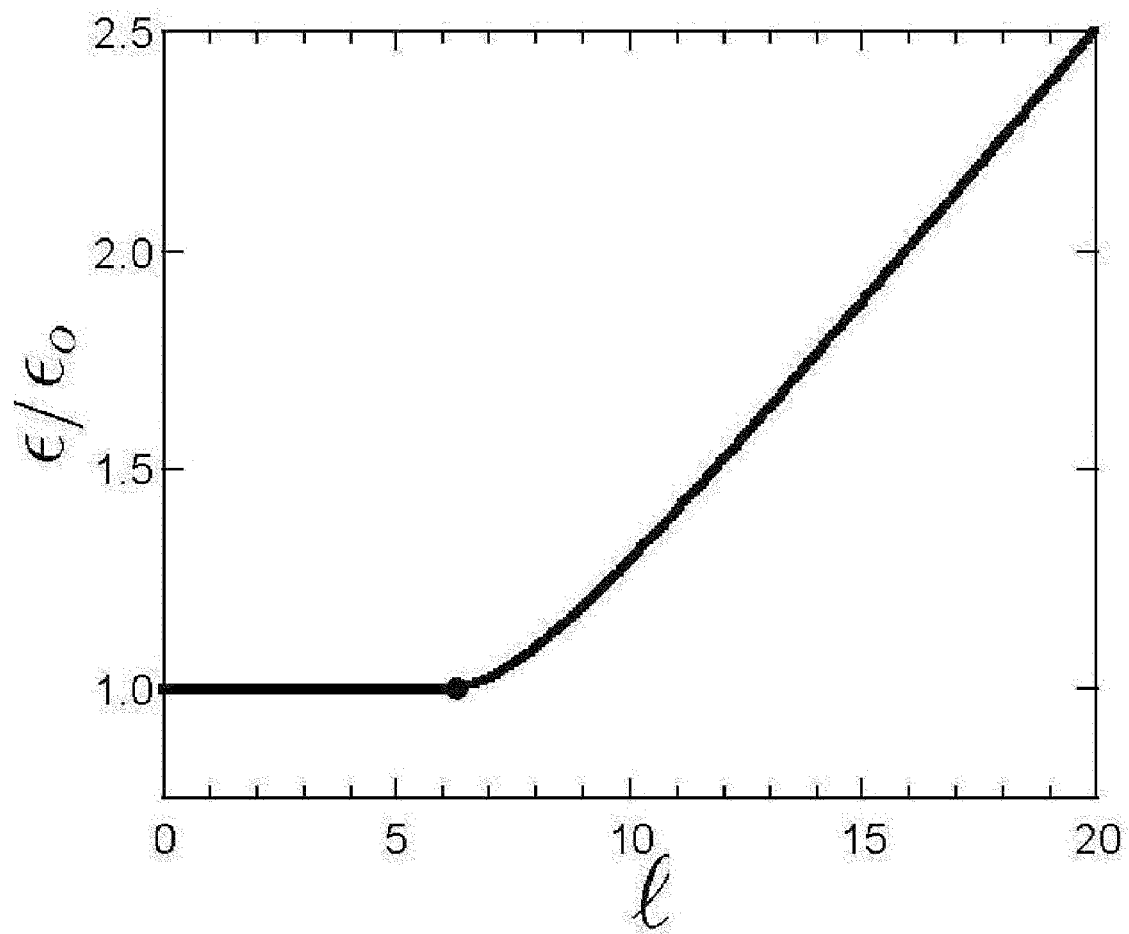
FIG. 19 is an illustration of the figure of merit of an annular magnetic device as a function of ring size in the constant and instanton saddle regimes.

FIG. 19 plots the figure of merit E as a function of the ring size l. The figure of merit $\epsilon$ has a constant value $\epsilon_0$ throughout the constant saddle regime, $l<2\pi$, given by (assuming h=0) $\epsilon_0$=2ea(d+1)/$\hbar$ P. As the ring size l increases, the instanton becomes the preferred saddle configuration, and the figure of merit $\epsilon$ increases. The dot in FIG. 19 indicates the transition between the constant saddle and instanton saddle regimes. In the limit $l \gg 2\pi$ (i.e. as the ring size becomes arbitrarily large), $\epsilon/\epsilon_0 \to 1/8$.

Figure 20:
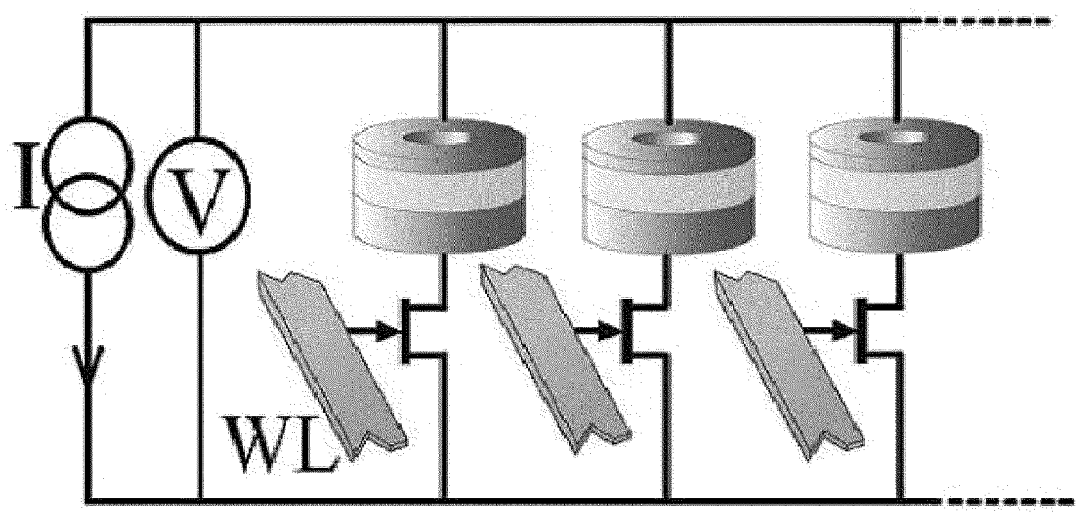
FIG. 20 is an illustration of a memory architecture constructed from annular magnetic devices according to embodiments of the present invention.

In some embodiments of the present invention, annular magnetic devices may be used to construct a memory cell architecture. FIG. 20 illustrates a memory cell architecture comprising bit cells that include annular magnetic devices. In FIG. 20, each bit cell includes at least one magnetic ring and at least one transistor for current control and readout. A voltage may be applied on the word line (WL) to address and activate a particular element in the memory array. In some embodiments, the transistors may be CMOS transistors. The current density per unit gate width for CMOS transistors is typically 1 mA/µm. Therefore, smaller switching currents for the annular magnetic devices permit smaller minimum feature sizes f, smaller transistors and, consequently, larger device integration density. The memory density of a memory architecture including annular devices is therefore a function of the ring size and the switching current. By way of example, a permalloy annular device with R=50 nm, $\Delta R$=20 nm, t=2 nm, $\alpha$=0.01 and P=0.4 would require transistors with a gate length of 0.5 µm. Assuming a lateral bit size of four times the minimum feature size, 4f, this exemplary device gives a bit areal density greater than $10^7$ devices/cm$^2$.

In another aspect of this invention, a magnetic ring device that has a radius greater than or equal to the critical radius can provide a very stable magnetization. Thus, if it is not a goal of the device to modify or reverse the magnetization of the device, a magnetic ring having a radius that is greater than the critical radius, can be easily employed in read only memory in a wide range of sizes greater than the critical size.

Figure 12:
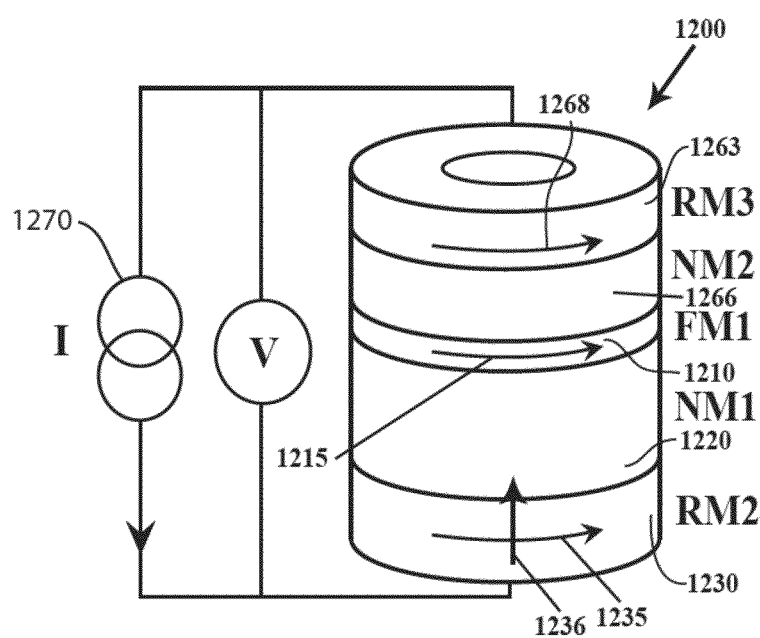
FIG. 12 is an illustration of an annular memory cell according to one embodiment of the present invention.

FIG. 12 illustrates a magnetic ring device 1200 employed as a magnetic memory element. Preferably, the free magnetic layer 1210 has a magnetic helicity 1215 with at least two stable orientations—a clockwise orientation and a counter-clockwise orientation. The reference layer 1230 preferably has a magnetic vector having a fixed direction at predetermined angle 1236, a fixed magnetic helicity 1235, or both a fixed magnetic vector having a direction at a predetermined angle 1236 and a fixed magnetic helicity 1235. Preferably, the predetermined angle of the fixed magnetic vector 1236 is substantially perpendicular to the plane of the reference layer 1230. The reference magnetic layer 1230 and the free magnetic layer 1210 are preferably separated by a non-magnetic layer 1220.

The direction of the free magnetic layer helicity can be changed or reversed by applying an electrical pulse across the layers of magnetic device 1200 from current source 1270. The pulse from control current source 1270 may initiate the reversal of the free magnetic layer helicity 1215. The spin-momentum of the reference magnetic layer 1230 may be transferred to the free magnetic layer 1210 so as to change the magnetization and induce reversal of the free magnetic layer helicity 1215. An electrical pulse in one direction across the device 1200 may set the free magnetic layer helicity 1215 in a clockwise direction, and an electrical pulse in the opposite direction may set the free magnetic layer helicity 1215 in a counter-clockwise direction.

The electrical pulse from control current source 1270 may initiate the reversal of the free magnetic layer helicity 1215. Reversal of the free magnetic layer helicity 1215 may stop when the second stable state is reached. However, a second current pulse from control current source 1270 can be used to stop the reversal of the free magnetic layer helicity 1215 more quickly. A reference layer 1230 having an easy axis 1236 (i.e., the energetically favorable direction of the spontaneous magnetization in a ferromagnetic material) that is substantially perpendicular to the free magnetic layer 1210 can lead to faster spin-transfer induced reversal of the free magnetic layer helicity 1215.

A second reference layer 1263 with fixed magnetic layer helicity 1268 may be used to read-out the helicity state of the free magnetic layer. The fixed magnetic helicity can be achieved, for example, by using a layer that is thicker than the free layer or a material having a larger magnetic anisotropy than the material of the free layer 1210, such as Cobalt, the L10 phase of FePt or FePd, or layered structures of Cobalt and Nickel. The second reference 1263 layer is preferably separated from the free magnetic layer 1210 by a non-magnetic layer 1266, which may be a thin non-magnetic metal or insulating layer. In the case of an insulating layer, the second reference layer 1263 and the free magnetic layer 1210 form a magnetic tunnel junction. If the free magnetic layer helicity 1215 and the second reference magnetic layer helicity 1268 are in the same direction (i.e., the magnetic helicities are both clockwise or both counter-clockwise), the resistance across the device 1200 may be generally smaller than if the free magnetic layer helicity 1215 and the reference magnetic layer helicity 1235 are in opposite directions, thereby differentiating between the two stable orientations of the free magnetic layer 1210.

Figure 13:
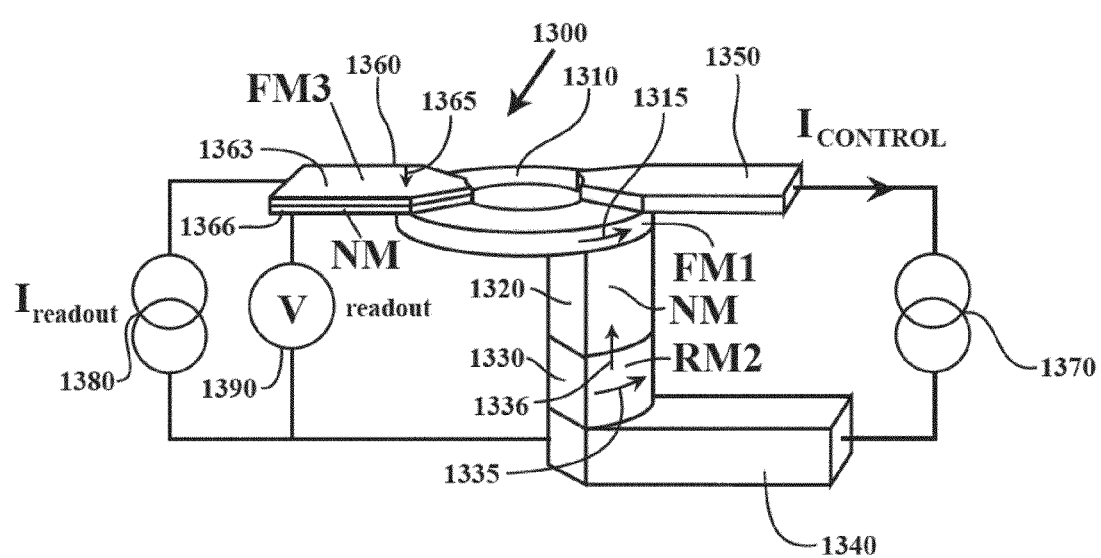
FIG. 13 is an illustration of an annular memory cell according to a further embodiment of the present invention in which separate read and write contacts are provided.

FIG. 13 illustrates a further embodiment of a magnetic ring device 1300 employed as a magnetic memory element in accordance with the present invention. Preferably, the free magnetic layer 1310 has at least two stable orientations of the free magnetic layer helicity 1315—a clockwise orientation and a counter-clockwise orientation. The reference layer 1330 preferably has a fixed magnetic vector 1336 having a direction at a predetermined angle, a fixed magnetic helicity 1335, or both a fixed magnetic vector 1336 having a direction at a predetermined angle 1336 and a fixed magnetic helicity 1335. Preferably, the predetermined angle of the fixed magnetic vector 1336 is substantially perpendicular to the plane of the reference layer 1330. The reference magnetic layer 1330 and the free magnetic layer 1310 are preferably separated by a non-magnetic layer 1320.

The direction of the free magnetic layer helicity can be changed or reversed by applying an electrical pulse across the layers of magnetic device 1300 from control current source 1370 through write contact 1350 and contact 1340. The pulse from control current source 1370 may initiate the reversal of the free magnetic layer helicity 1315. The spin-momentum of the reference magnetic layer 1330 may be transferred to the free magnetic layer 1310 so as to change the magnetization and induce reversal of the free magnetic layer helicity 1315. An electrical pulse in one direction across the device 1300 may set the free magnetic layer helicity 1315 in a clockwise direction, and an electrical pulse in the opposite direction may set the free magnetic layer helicity 1315 in a counter-clockwise direction.

The electrical pulse from control current source 1370 may initiate the reversal of the free magnetic layer helicity 1315. Reversal of the free magnetic layer helicity 1315 may stop when the second stable state is reached. However, a second current pulse from control current source 1370 can be used to stop the reversal of the free magnetic layer helicity 1315 more quickly.

A reference layer 1330 having an easy axis (i.e., the energetically favorable direction of the spontaneous magnetization in a ferromagnetic material) that is substantially perpendicular to the free magnetic layer 1310 can lead to faster spin-transfer induced reversal of the free magnetic layer helicity 1315.

Current injection need not be symmetric. Local injection of the current may be used to initiate the change in the free magnetic layer helicity 1315. Transfer of spin angular momentum may serve to nucleate magnetization reversal with current spin-polarized by the reference layer 1330. Layer 1320 is a spin preserving non-magnetic layer such as Cu, Ag, Au or a thin insulating layer such as $Al_2O_3$ or MgO. Small asymmetry in the ring may facilitate nucleation and reversal through spin-momentum transfer. Pronounced asymmetry could reduce the magnetization stability, which is undesirable.

The state of the free magnetic layer helicity can be determined by measuring the voltage or resistance across the device 1300. If the free magnetic layer helicity 1315 and the reference magnetic layer helicity 1335 are in the same direction (i.e., the magnetic helicities are both clockwise or both counter-clockwise), the resistance across the device 1300 may be generally smaller than if the free magnetic layer helicity 1315 and the reference magnetic layer helicity 1335 are in opposite directions.

Currently available magnetic memory devices typically require relatively high currents and low impedance to write information (i.e., modify the magnetic helicity of the device), whereas readout is done with smaller currents but requires a large readout signal. The ring geometry of the magnetic device 1300 addresses these contradicting requirements by allowing the performance of the reading and writing operations in different locations on the device. A write operation can be performed by control current source 1370, which provides a large current, and write contact 1350, which can be in direct contact with either the free magnetic layer 1310 or the reference magnetic layer 1330 thus having low impedance. The write operation circuit is completed through contact 1340 which can be placed in direct contact with either the free magnetic layer 1310 or the reference magnetic layer 1330 to complete the circuit across device 1300.

The read operation can be performed using a separate readout circuit. Read contact 1360 can include a magnetic contact portion 1363 with a fixed magnetization direction or helicity 1365 and an insulator portion 1366 that separates the magnetic contact 1363 from the device 1300, thereby forming a magnetic tunnel junction with the device 1300. A separate readout current source 1380 can provide a smaller current across the device 1300 which is measured by voltage or resistance readout 1390.

Preferably, the device has a thickness of approximately 1 to 5 nanometers, a mean outer radius of approximately 20 to 250 nm and a ring width of approximately 8 to 100 nm.

Typical multi-element magnetic devices have strong magnetostatic interaction between the different elements. This interaction can be difficult to quantify or control, and thus results in problems increasing density and performance of the device. The present invention may minimize these interactions. Additionally, the device avoids the problems of magnetic field spreading which results in superior speed writing and readout along with reduction of error due to stray or poorly controlled fields.

While there has been described what are at present considered to be embodiments of the present invention, it will be understood that various modifications may be made thereto, and it is intended that the appended claims cover all such modifications as fall within the true spirit and scope of the invention.

Magnetic tunnel junctions offer the possibility of very large magnetoresistance that can be used to read the state of a magnetic memory cell. A magnetic tunnel junction consists of two magnetic layers separated by a thin insulating layer. The insulator is sufficiently thin that electrons may traverse this layer by quantum mechanical tunneling. The thickness of the insulator is typically between 0.3 and 3 nm.

A large magnetoresistance will provide a large readout signal. It has been shown experimentally that very large magnetoresistance can be achieved using magnesium oxide (MgO) insulating barriers. The magnetoresistance refers to the percentage change in resistance between states in which the layers are magnetized antiparallel and parallel. A magnetoresistance of greater that 400% has been achieved recently with MgO insulating layers. With an aluminum oxide insulating layer, a magnetoresistance of about 30% has been achieved. Either of these materials as well as other insulators may prove useful as the non-magnetic layers, N1 or N2.

Note that current must pass through the insulating layer during the switching process. An exception to this is the device represented in FIG. 10, in which there is a separate electrical contact to N1. This means the insulator must not be damaged in the presence of this current or, equivalently, the voltage that appears across the junction in the presence of the current. Thin insulating barriers typically support 1 V/nm electric fields before damage, known as voltage breakdown. The current required to switch the junction must not produce electric fields in the junction that exceed the insulator breakdown electric field.

The pinned magnetic layer of the device may include a material with a perpendicular magnetic anisotropy. A perpendicular magnetic anisotropy gives a preference for the magnetization to orient perpendicular to the plane of the layer. Thin magnetic layers are typically magnetized in the film plane. This orientation is usually a lower energy configuration; it reduces the layer's magnetostatic energy. To orient the magnetization perpendicular to the plane the perpendicular magnetic anisotropy must be sufficiently large compared to the magnetostatic energy of the layer.

This can be achieved with a number of different materials. For example, alloys of Fe and Pt, Fe and Pd, Co and Pt, Co and Pd, Co and Au, Co and Ni. This can also be achieved by creating interfaces between dissimilar magnetic materials or magnetic materials and non-magnetic materials. An example of the former, is layered structures of Co and Ni and example of the latter is layered structure of Co and Au or Co and Pt. An advantage of these layered materials is that they need not be crystalline; polycrystalline layers suffice.

This layer serves to spin polarize the current. The materials should have good spin polarization efficiency. A disadvantage of using Pd or Pt is that these elements typically induce strong spin-scattering which reduces the layer spin-polarization. Large layer spin-polarization is needed for efficient device operation.

The free layer's magnetization direction switches in response to a current pulse. It is desirable to reduce the amplitude of this current pulse to lower the power required for device operation. Current requirements are linked to the magnetization density, damping and magnetic anisotropy of the layers. The lower the magnetization density and magnetic anisotropy the lower the required current amplitude for switching. The magnetization density of a magnetic is lowered if the magnetic material is alloyed with a non-magnetic material. (Of course, this only holds in a range of alloy concentrations. Eventually the material will become non-magnetic.)

It should be noted that the switching current amplitude and switching time are interdependent. For example, lower magnetization density increases the time to reverse the magnetization.

It may be desirable to increase the magnetization damping of the free magnetic layer to increase the device reliability. It is the expectation that increasing the damping would increase the parameter range for switching. That is, the device would switches reproducibly between states for a greater range of current pulse amplitudes, times and current pulse shapes.

The present invention is directed to orthogonal spin transfer MRAM (OST-MRAM) devices and methods. OST-MRAM employs a spin-polarizing layer magnetized perpendicularly to a free layer to achieve large initial spin-transfer torques. This geometry has significant advantages over collinear magnetized STT-MRAM devices as it eliminates the nanosecond incubation delay and reduces the stochastic nature of the switching. It also has the potential for write times below 50 ps. FIG. 21(*a*) illustrates one embodiment of a STT-MRAM. A perpendicularly magnetized polarizer (P) is separated by a non-magnetic metal from the free magnetic layer (FL). The free layer forms one electrode of a MTJ. The other electrode, the reference layer, consists of an SAF free layer.

In OST-MRAM the reference magnetic layer is used to read out the magnetic state. The magnetization of this layer is set to be collinear to that of the free layer and the memory states correspond to the free layer magnetization parallel (P) or antiparallel (AP) to the reference layer magnetization. Previous OST-MRAM devices utilized an out-of-plane magnetized spin-polarizer was combined with an in-plane magnetized spin-valve. While fast switching was seen, the resulting read-out signals were small; there was less than ~5% magnetoresistance (MR). The device impedance was also small, ~5Ω.

One embodiment of the present invention is directed to a magnetic tunnel junction (MTJ) based OST-MRAM device that combines fast switching and large (>100%) MR, both of which are critical for applications. The device impedance is ~1 kΩ and thus compatible with complementary metal-oxide-semiconductor (CMOS) field effect transistor (FET) memory control circuitry. The write function switches the state of the cell, rather than setting the state. Further, the switching is bipolar, occurring for positive and negative polarity pulses, consistent with a precessional reversal mechanism.

In one embodiment, the present invention provides apparatus and methods enabling a "toggle" mode of spin-transfer device operation. The pulse source may be unipolar because the bit cell does not set the state based upon the polarity of the pulse, i.e. it is bipolar. Rather a pulse of sufficient amplitude for either polarity will "toggle" the magnetic state of the device, "1"→"0" and "0"→"1". Thus, a pulse (of sufficient time and amplitude) will change the magnetic state of the device or bit cell, irrespective of the original magnetic state. As such, in one embodiment, the writing of information in such a "toggle" mode of operation may require reading the device or bit cell initial state and either applying or not applying a current/voltage pulse depending on the information to be written. That is, if the device or bit cell was already in the desired state no pulse would be applied.

Figure 22:
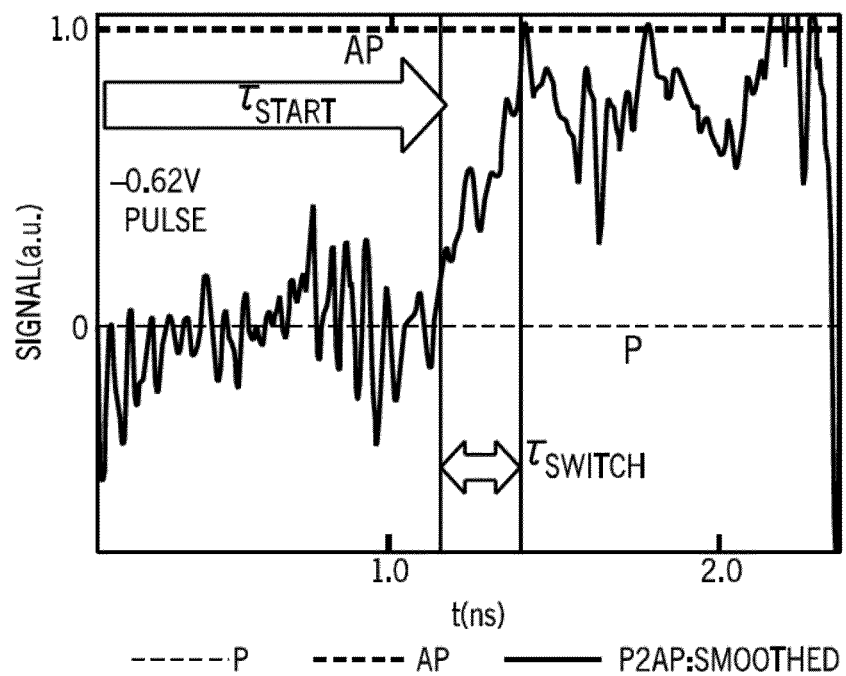
FIG. 22 is an example of precessional switching and illustrates a pulse for producing magnetization precession.

As an example of this embodiment, FIG. 22 illustrates an experimental time resolved voltage trace of a bit cell switching event. A voltage pulse of −0.62 V is applied for about 2 ns, starting at time zero in the plot. The device is a 50 nm×115 nm ellipse shaped bit cell and has an impedance of about 2 kOhm. The horizontal dashed trace at the signal level of 1 corresponds to the antiparallel state (AP). The horizontal dashed trace at signal level 0 shows the response when the bit cell is in the parallel (P) state. (P and AP refer to the magnetization direction of the free layer with respect to the reference layer magnetization in the stack.) At about 1.1 ns the device switches from the P to the AP state. The device then precesses at a frequency of about 3 GHz. The device final state (P or AP) depends in the pulse duration.

The use of a bipolar toggle for STT-MRAM allows the external drive circuitry to be simplified because all device operations (i.e., reading and writing) can be accomplished with a power source of one polarity. In addition, it is believed that devices utilizing the present invention will likely operate faster because pulses of less than 500 psec will toggle the magnetic state of the device. An additional benefit of the need for only one polarity is that power consumption will be reduced. This is due, in part, to the fact that the supply voltages to the device do not need to be switched between different levels. In present MRAM-CMOS designs, typically one transistor is associated with each MRAM bit cell and the source and drain voltages on this transistor need to be varied to write the information. In accordance with one embodiment of the present invention, the source or drain voltages may be maintained at constant levels. Maintaining the source or drain voltages at a constant level(s) reduces the power required for device operation, as each time the polarity of a supply voltage is changed energy is required. In one embodiment, switching requires an energy of less than 450 fJ in a free magnetic layer that is thermally stable at room temperature.

As previously mentioned hereinbefore, one characteristic of the described OST-MRAM devices is that the switching is bipolar, i.e. a bit cell in accordance with the present invention may be switched between states using either voltage pulse polarity. However, there can be thresholds for the pulse to trigger a switch. Those thresholds may differ depending on the pulse, for example depending on the pulse polarity or depending on the device initial state, i.e. P or AP. This characteristic is illustrated further below regarding the examples in FIGS. 24(a) and 24(b).

Figure 24A:
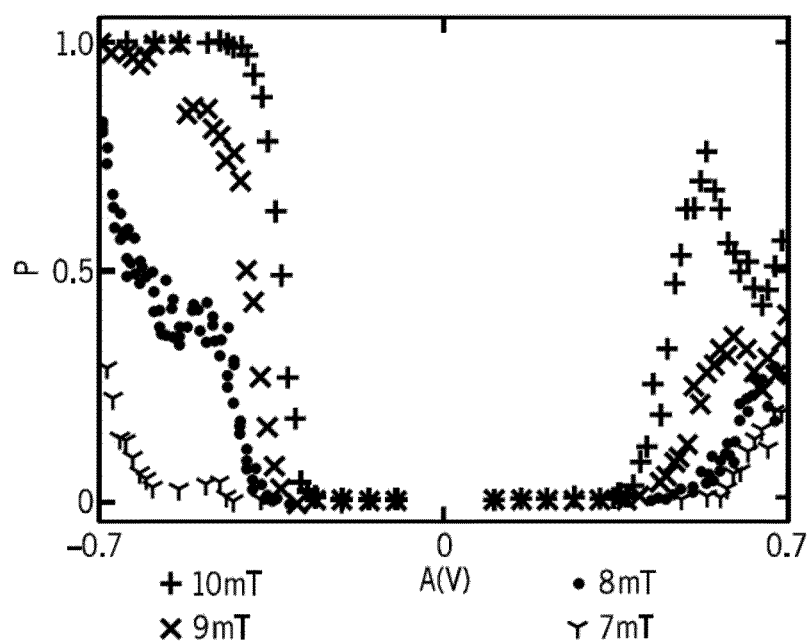
FIGS. 24(a) and 24(b) are graphs of switching probability as a function of pulse amplitude at a fixed pulse duration of 700 ps with FIG. 24(a) P to AP state.
Figure 24B:
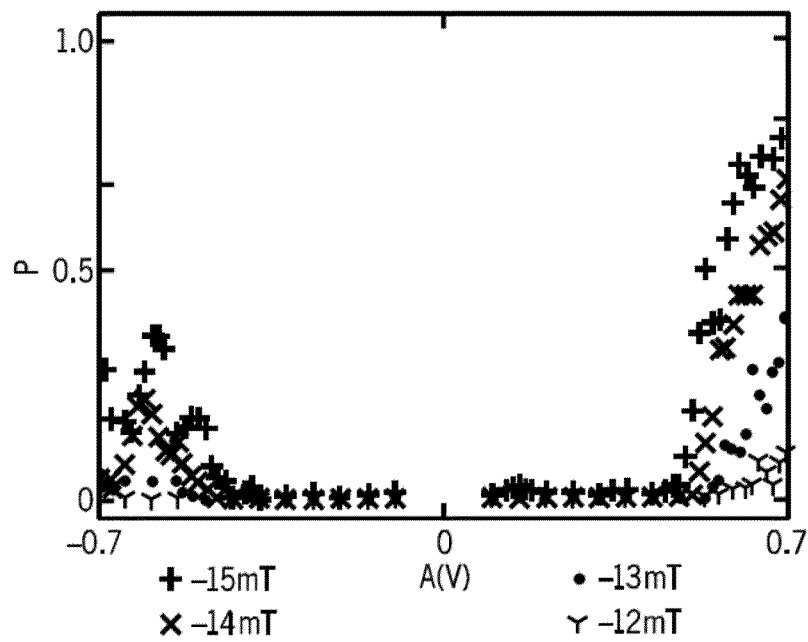

This asymmetry in the probability distribution for the two polarities is distinct from the characteristics seen in common collinear free layer/tunnel barrier/SAF type STT devices. In these devices switching only occurs for one polarity of the voltage pulse, or through thermally induced backhopping. As previously stated, in OST-MRAM devices switching occurs for both polarities. This bipolar switching process is an indication that the torque originates from the perpendicular polarizer. For a collinear device we would expect P→AP switching only for positive polarity pulses, based on spin-transfer torque models. For one embodiment of the invention, a positive polarity pulse leads to a lower switching probability (FIG. 24(a)) compared to the opposite polarity pulse. If the switching processes involved simple heating of the junction, rather than the spin-transfer torque switching in the OST-MRAM device as described herein, it would be expected that a symmetric switching probability distribution and a monotonic dependence of the switching probability on pulse amplitude would be observed, which is not the case as seen in FIGS. 24(a) and 24(b).

Figure 25:
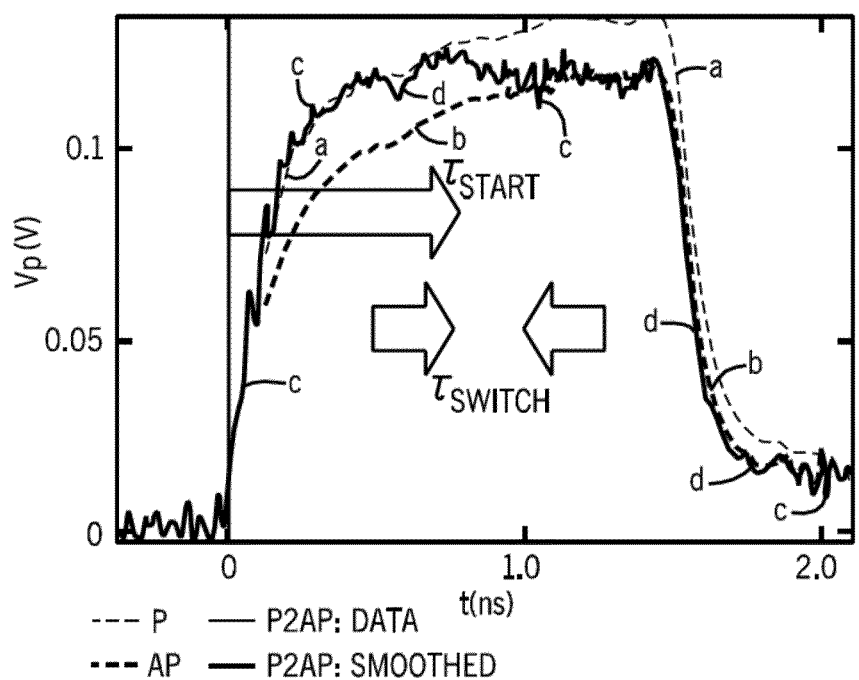
FIG. 25 is an example of direct switching and shows a voltage trace of a bit cell switching event.
Figure 26A:
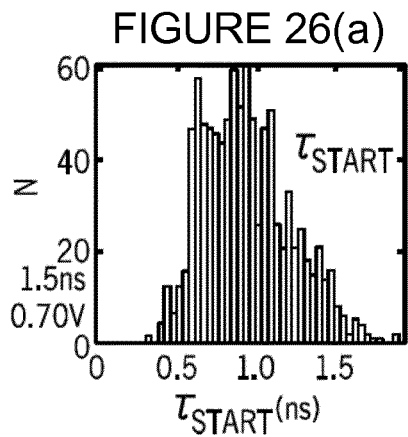
FIGS. 26(a)-26(f) illustrate the statistical probability from P to AP as a function of the pulse amplitude; larger pulse amplitudes produce shorter switching start times and shorter times to switch.
Figure 26D:
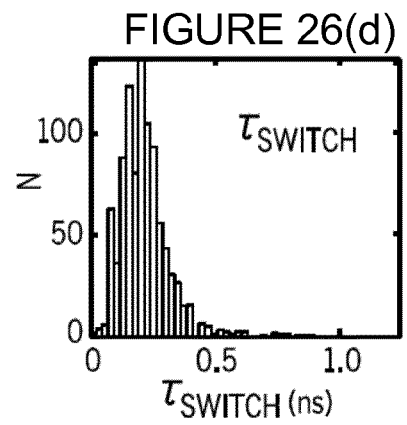
Figure 26B:
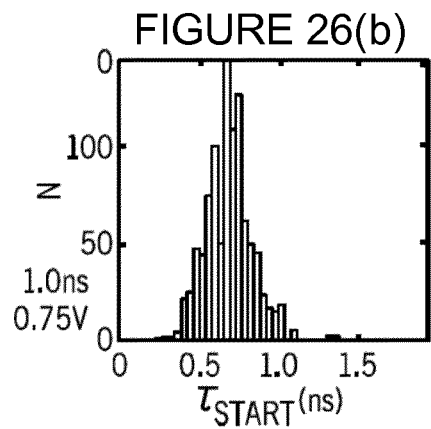
Figure 26E:
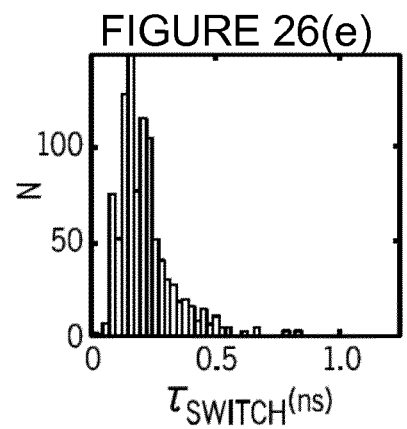
Figure 26C:
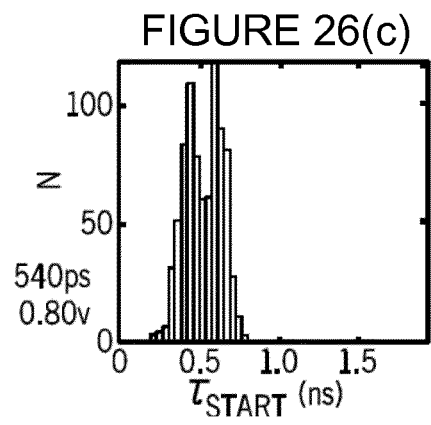
Figure 26F:
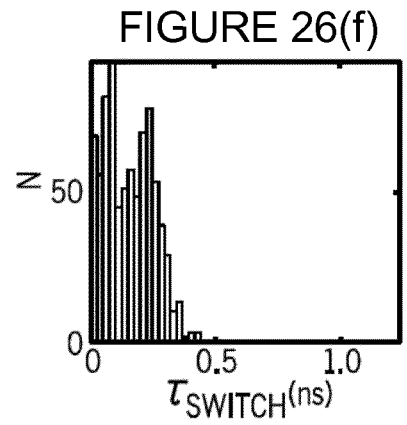

As an example of this embodiment, FIG. 25 illustrates an experimental time resolved voltage trace of a bit cell switching event. A voltage pulse of 0.7 V is applied for about 2 ns, starting at time zero in the plot. The device is a 60×180 nm² shaped hexagon and has an impedance of order of 1 kOhm. The dotted line trace "a" shows the response when the bit cell is in the parallel state (P). The line trace "b" shows the response when the bit cell is in the antiparallel (AP) state. (P and AP refer the magnetization direction of the free layer with respect to the reference layer magnetization in the stack.) The line trace "c" shows an event in which the device switches from P to AP about 1.2 ns after the start of the pulse. The line trace "d" shows the same data filtered to remove the high frequency components, which is associated with noise. The start time and switching time are defined as indicated in this FIG. 25.

The free layer magnetization rotation about its demagnetizing field will result in a switching probability that is a nonmonotonic function of the pulse amplitude or duration, because if the pulse ends after the free layer magnetization finishes a full rotation (i.e., a 2π rotation), the probability of switching will be reduced. The precession frequency can also be a function of the pulse polarity due to the fringe fields from the polarizing and reference layers. Further, spin-torques from the reference layer break the symmetry of the reversal by adding torques that favor one free layer state over another.

Thus, a device in accordance with the principles of the present invention can utilize voltage/current pulses of just one polarity to write both "0" and "1" states. A device initially in the "1" state can be switched to a "0" state and a device originally in the state "0" can be switched into the state "1" with the same polarity pulse. Further, although the pulse amplitudes needed for these operations can differ (see FIGS. 24(a) and 24(b)), this aspect can be used to advantage in device operation. For example, if the thresholds differ then the pulse amplitude can uniquely determine the device final state. In one embodiment, the differences between the thresholds for a positive polarity pulse and a negative polarity pulse can be significant enough that a read step would be unnecessary. For example, where a negative pulse requires a much lower amplitude and or pulse duration to achieve a 100% probability of a switch from P to AP than the positive pulse and vice versa, the positive pulse requires a much lower amplitude or pulse duration to achieve 100% probability of a switch from AP to P, those thresholds can be utilized to achieve a desired functionality. If the positive pulse that is necessary to switch from AP to P would be below the threshold necessary to switch from P to AP and vice versa for the negative pulse, then a device need not read the bit cell prior to a write. For example, where a write of the bit cell to P state is desired, the device can be pulsed with a sufficient (above the 100% threshold for switching to P but below that threshold for a switch to AP) positive pulse. If the bit cell is in AP, the positive pulse is sufficient to switch to P. However, if the bit cell is already in P, the positive pulse would be insufficient (i.e. below the threshold) to switch to AP.

The following non-limiting Examples illustrate various attributes of the invention.

Example 1

Figure 21A:
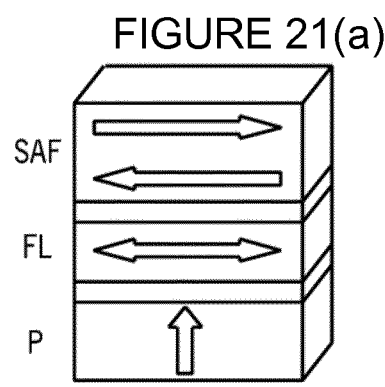
FIG. 21(a) illustrates a OST-MRAM layer stack.
Figure 21B:
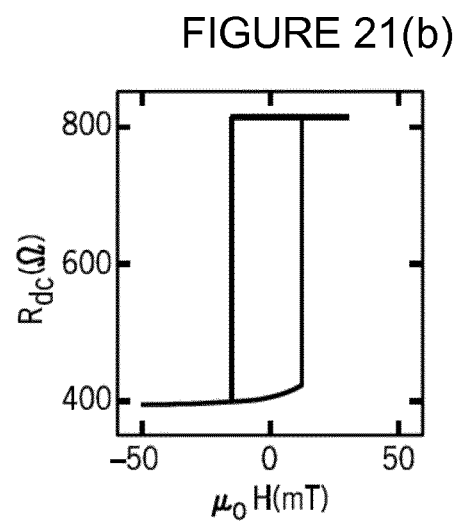
FIG. 21(b) is a graph of device resistance vs. in-plane field showing 107% magnetoresistance (MR) and the switching of the free layer from the parallel (P) to antiparallel (AP) state at 12 mT and AP to P state at −16 mT. 1.
Figure 21C:
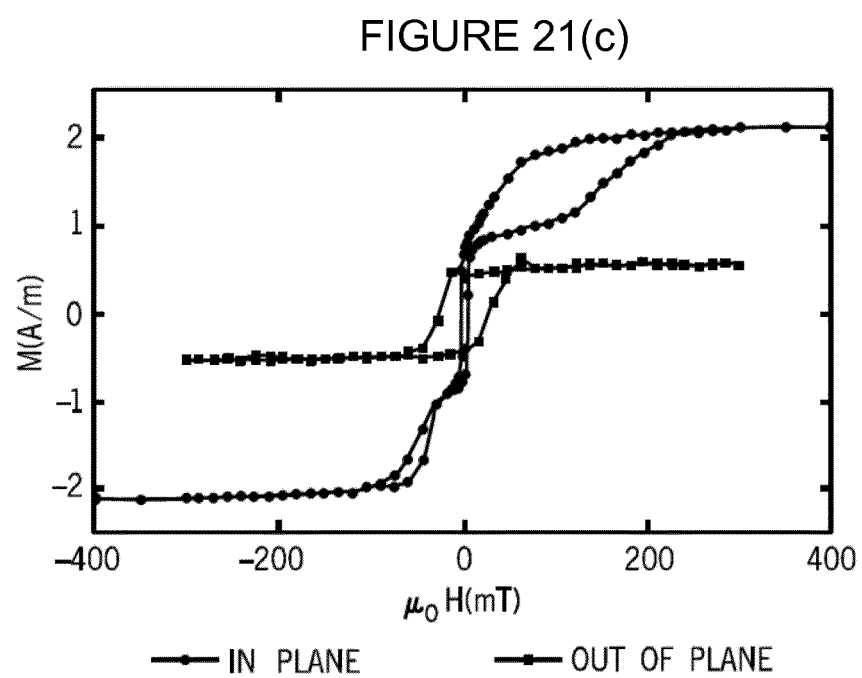
FIG. 21(c) is a graph of device vibrating sample magnetometry (VSM) measurements of the magnetization of the layer stack wherein the dotted line curve shows the switching of the free layer and (synthetic anti-ferromagnetic) (SAF) free layer under an in-plane applied field and the squared line red curve shows the characteristics of the polarizing layer, under a field perpendicular to the plane, demonstrating the high remanence and a coercive field of 50 mT.

The OST-MRAM layer stack was grown on 150 mm oxidized silicon wafers using a Singulus TIMARIS PVD module. The device layer structure is illustrated in FIG. 21(a). The polarizer consists of a Co/Pd multilayer exchange coupled to a Co/Ni multilayer. The Co/Ni multilayer has a high spin polarization due to the strong spin-scattering asymmetry of Co in Ni and a perpendicular magnetic anisotropy (PMA). To enhance the layer coercivity and remanence this layer is coupled to Co/Pd which has a very large PMA but a lower spin polarization due to the strong spin-orbit scattering by Pd. The polarizer is separated by 10 nm of Cu from an in-plane magnetized CoFeB free layer that is one of the electrodes of a MTJ. The MTJ structure is 3 CoFeB|0.8 MgO|2.3 Co$_{0.4}$Fe$_{0.4}$B$_{0.2}$|0.6 Ru|2 Co$_{0.4}$Fe$_{0.3}$ 16 PtMn (number to the left of each composition indicates the layer thicknesses in nm). The wafer was annealed at 300° C. for 2 hours in a magnetic field and then characterized by vibrating sample magnetometry (VSM), ferromagnetic resonance spectroscopy (FMR), and current-in-plane-tunneling (CIPT) measurements. FIG. 21(c) shows VSM measurements of the film magnetization for in-plane and perpendicular-to-the-plane applied fields. The free layer is very soft while the reference layer has a coercive field of about 50 mT; the exchange bias from the antiferromagnetic PtMn is 100 mT. The perpendicular polarizer has a coercive field of 50 mT.

The wafers were patterned to create OST-MRAM devices using e-beam and optical lithography. Ion-milling was used to etch sub-100 nm features through the free layer. Device sizes varied from 40 nm×80 nm to 80 nm×240 nm in the form of rectangles, ellipses and hexagons. Approximately 100 junctions were studied. Set forth in greater detail below are results obtained on one 60 nm×180 nm hexagon shaped device. Although not presented here, similar results have been obtained on other devices of this type.

The sample resistance was measured by applying a small voltage (V$_{dc}$, =30 mV) and measuring the current. The MR of the device is mainly determined by the relative orientation of the free (3 CoFeB) and reference (2.3 CoFeB) layers, which can be either parallel (PA) or antiparallel (AP). FIG. 21(b) shows the minor hysteresis loop of the free layer. The patterned free layer has a coercive field of 14 mT at room temperature and the device has 107% MR. The loop is centered at about −2 mT, due to a small residual dipolar coupling from the synthetic antiferromagnetic (SAF) reference layer.

To measure the current-induced switching probability, pulses of variable amplitude, duration and polarity were applied. An applied field was used to set the sample into the bistable region (see FIG. 21(b)) and then voltage pulses were applied, using a pulse generator that provides up to 2 V amplitude with a minimum pulse duration of 50 ps. By measuring the resistance using a small dc voltage before and after the pulse, we can determine the device state. Since the free layer is very stable without any applied voltage (see the discussion below), it can be assumed that a switching event (i.e., dynamics of the free layer magnetization to a point at which the free layer magnetization would reverse in the absence of the pulse) occurred during the voltage pulse. In this setup, positive voltage is defined to correspond to electrons flowing from the bottom to the top of the layer stack, i.e. from the polarizer toward the free and reference layers.

Figure 23:
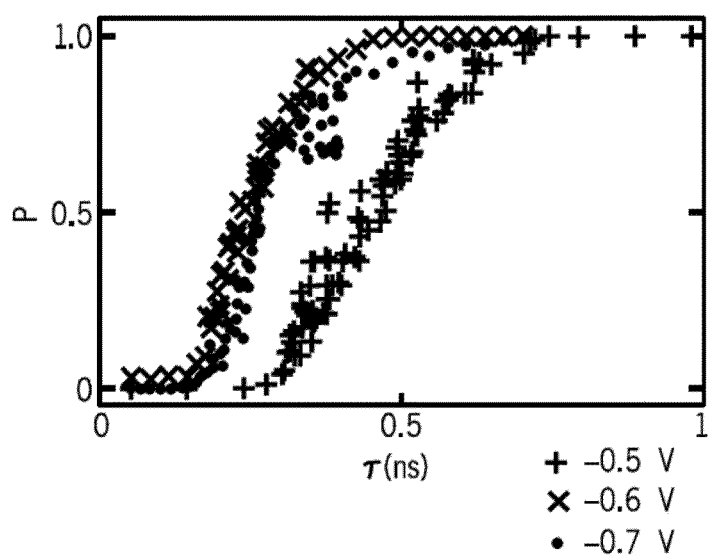
FIG. 23 is a graph of the switching probability from the P to the AP state as a function of pulse duration for three different pulse amplitudes at an applied field of 10 mT. 100% switching probability is achieved for pulses of less than 500 ps duration.

Both amplitude and pulse duration where observed to impact the probability of a switching event. FIG. 23 shows the switching probability from the P to the AP state as a function of pulse duration in an applied field of 10 mT for three different pulse amplitudes, −0.5, −0.6 and −0.7 V. Higher amplitude pulses lead to switching at shorter pulse durations. It has been observed that a device in accordance with the present invention can be switched with pulses less than 500 ps in duration with 100% probability. The energy needed for 100% probability switching is less than 450 fJ. As 100% switching probability was observed for pulses as short as 500 ps, it is believed that there is no incubation delay of several nanoseconds as observed in conventional collinear or nearly collinearly magnetized devices. The switching process of the present invention thus provides both fast and predictable results.

To determine the energy barrier of the reversal, the coercive field of the sample is measured at different field sweep rates. The energy barrier is then determined from the relation:

$$\tau = \tau_0 \exp\left[\xi_0\left(1 - \frac{H_{app}}{H_c}\right)^\beta\right], \tag{1}$$

where $\xi_0 = U_0/kT$, the zero applied field energy barrier over the thermal energy, with T=300 K. Assuming β=2, we obtain an energy barrier of ξ=40 at $\mu_0 H_{app}$=0.01 T, indicating the layer is very thermally stable at room temperature.

As previously mentioned, one characteristic of the described OST-MRAM devices is that the switching is bipolar, i.e. a bit cell in accordance with the present invention may be switched between states using either voltage pulse polarity. For the examples described above, FIG. 24(a) shows the switching probability versus pulse amplitude for (a) P→AP switching and FIG. 24(b) shows AP→P switching at a pulse duration of 700 ps. Although the OST-MRAM device is bipolar, it can be seen in FIG. 24(a) that negative polarity pulses lead to higher switching probability than positive polarity pulses. The opposite is found in FIG. 24(b) for AP→P. In both cases applied fields closer to the coercive field lead to a lower voltage pulse threshold for switching. Also the switching probability is a nonmonotonic function of the pulse amplitude. The observed data is qualitatively consistent with precessional reversal being driven by the perpendicular polarizer.

Example 2

The magnetization dynamics of the device and method in the preferred embodiment can be modeled to a first approximation by considering the spin transfer torques associated with the perpendicular polarizer and the reference layer as follows:

$$\frac{d\hat{m}}{dt} = -\gamma\mu_0 \hat{m} \times \vec{H}_{eff} + \alpha\hat{m} \times \frac{d\hat{m}}{dt} + \gamma a_J \hat{m} \times (\hat{m} \times \hat{m}_P) - \beta\gamma a_J \hat{m} \times (\hat{m} \times \hat{m}_R) \quad (2)$$

where m represents the magnetization direction of the free layer (it is a unit vector in the direction of the free layer magnetization). $\alpha$ is the damping parameter of the free layer. The prefactor, $a_J$, depends on the current density J, the spin-polarization P of the current density J, and the cosine of the angle between the free and pinned magnetic layers, $\cos(\theta)$, such that $a_J = \hbar Jg(P, \cos(\theta))/(eMt)$. The $\hbar$ is the reduced Planck's constant, g is a function of the spin-polarization P and $\cos(\theta)$, M is the magnetization density of the free layer, e is the charge of an electron, and t is the thickness of the free layer. The last two terms are the spin transfer from the perpendicular polarizer ($m_P$) and the in-plane magnetized reference layer ($m_R$). The $\beta$ (beta) represents the ratio of the magnitude of these two torques.

Figure 27C:
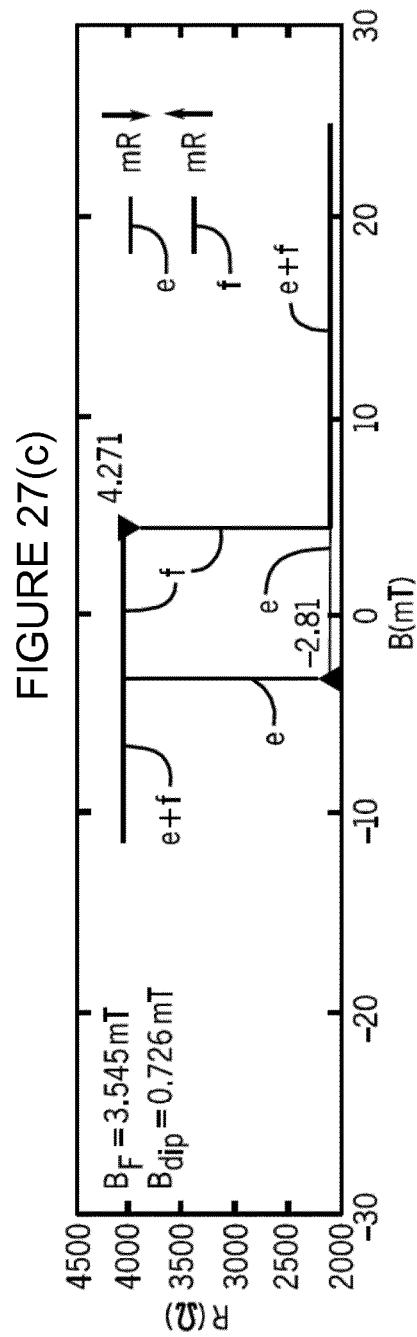
Figure 28A:
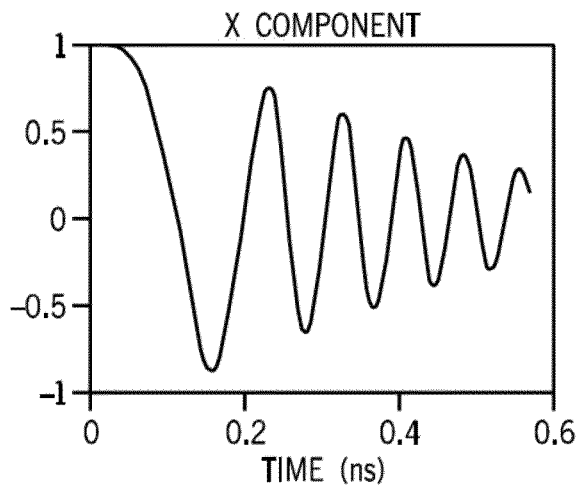
FIGS. 28(a)-28(c) show for conditions ($\beta$=1, $a_j$=+0.025) the magnetization switching is precessional, starting at time zero from a P state; the three components of the magnetization are show, $m_x$, $m_y$ and $m_z$.
Figure 28B:
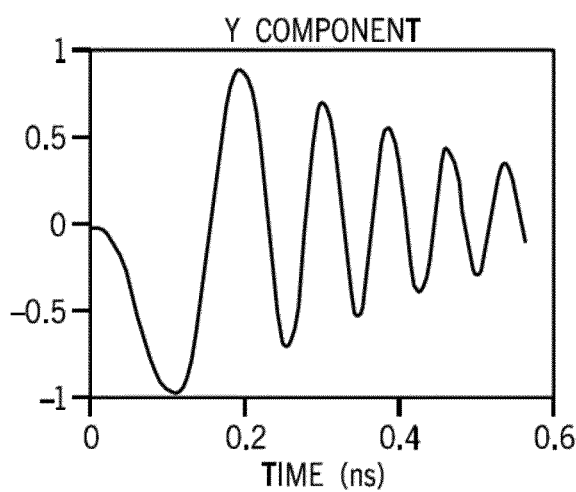
Figure 28C:
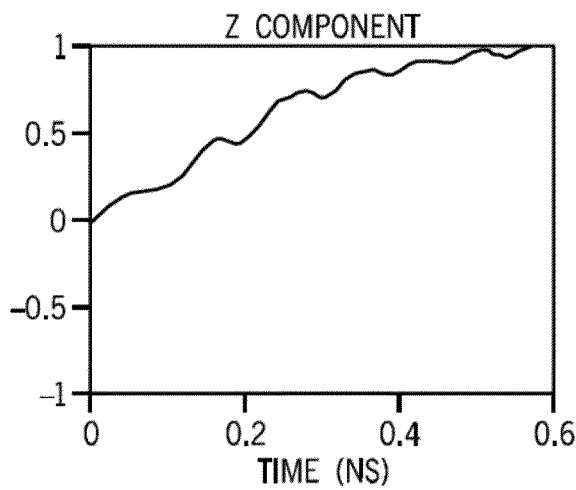
Figure 29A:
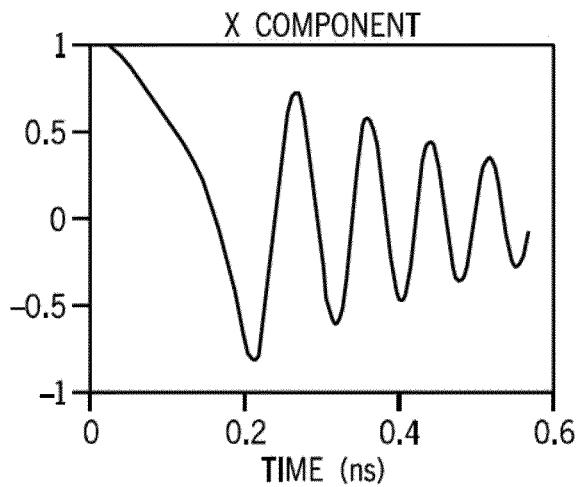
FIGS. 29(a)-29(c) show for conditions ($\beta$=1, $a_j$=−0.025) the magnetization switching is precessional, this shows that both positive and negative polarity pulses lead to precessional magnetization reversal, with somewhat different rates (or frequencies) of precession.
Figure 29B:
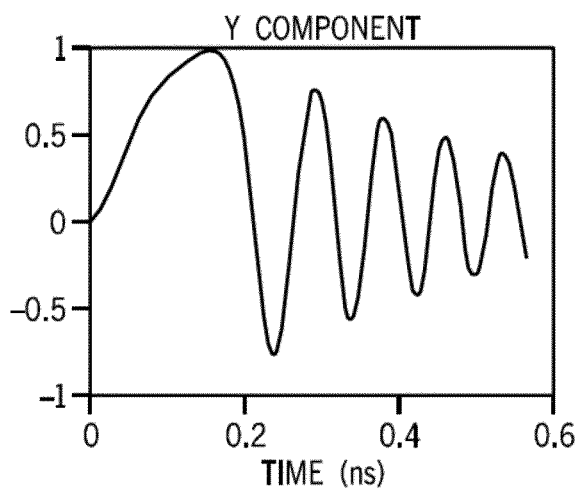
Figure 29C:
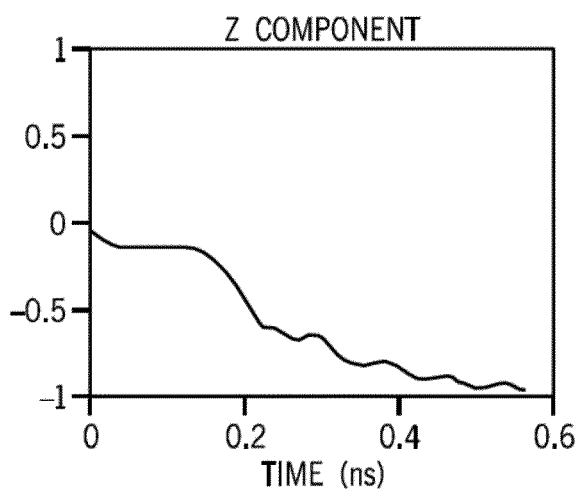
Figure 30A:
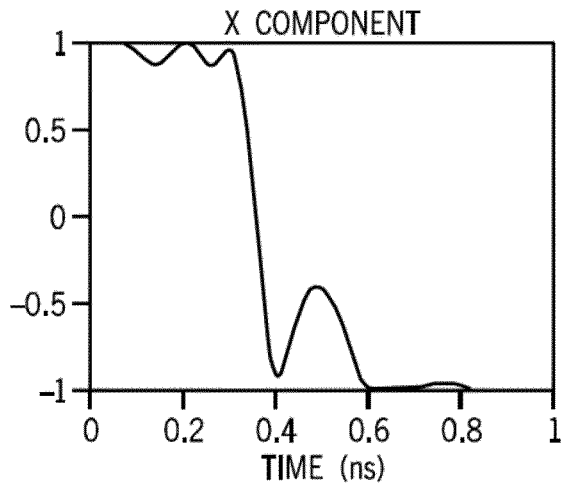
FIGS. 30(a)-30(c) show for conditions ($\beta$=5, $a_j$=+0.008) the magnetization switching from P to AP is direct (i.e. there is no precession)
Figure 30B:
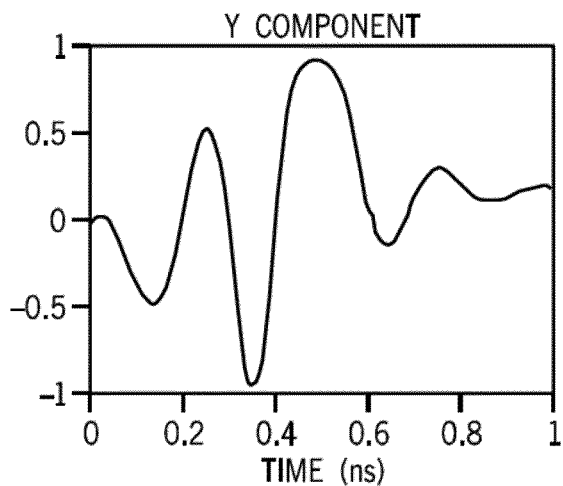
Figure 30C:
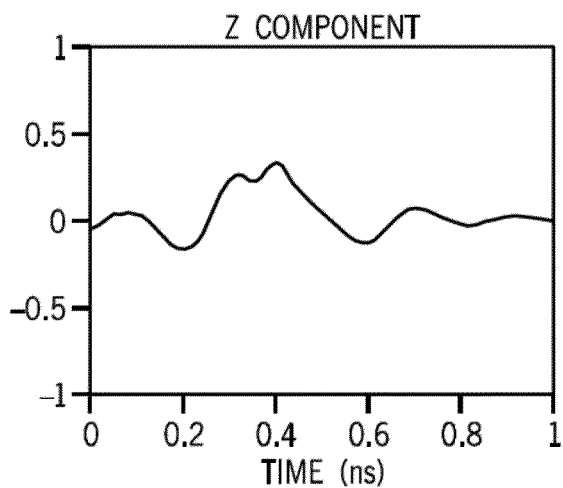
Figure 31A:
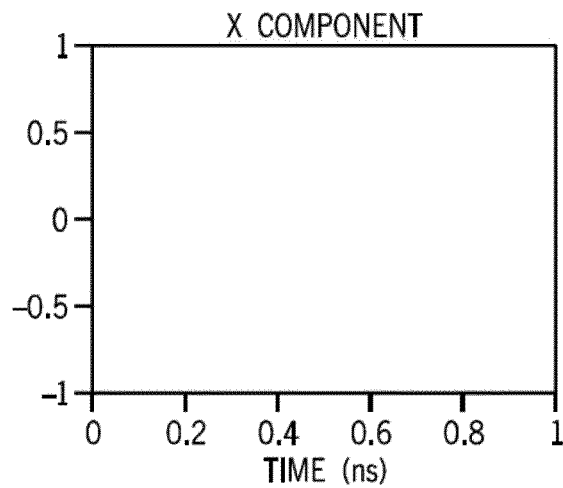
FIGS. 31(a)-31(c) show for conditions ($\beta$=5, $a_j$=−0.008) there is no switching from the P state; only a positive pulse (FIG. 10(a)-10(c)) leads to magnetization switching from the P to the AP state.
Figure 31B:
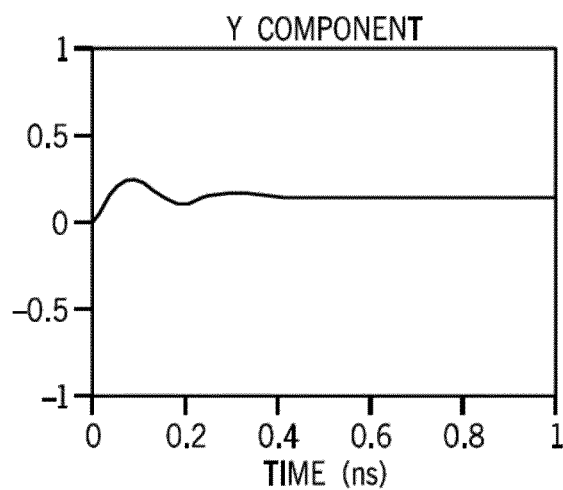
Figure 31C:
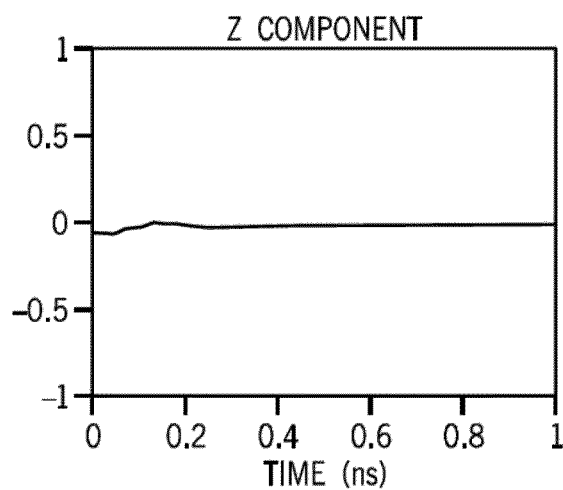
Figure 32A:
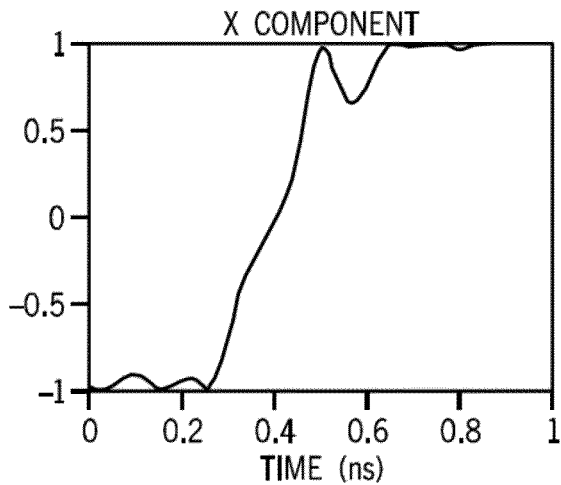
FIGS. 32(a)-32(c) show for conditions ($\beta$=5, $a_j$=−0.006, i.e. negative pulse polarities) there is direct switching from the AP to P state.
Figure 32B:
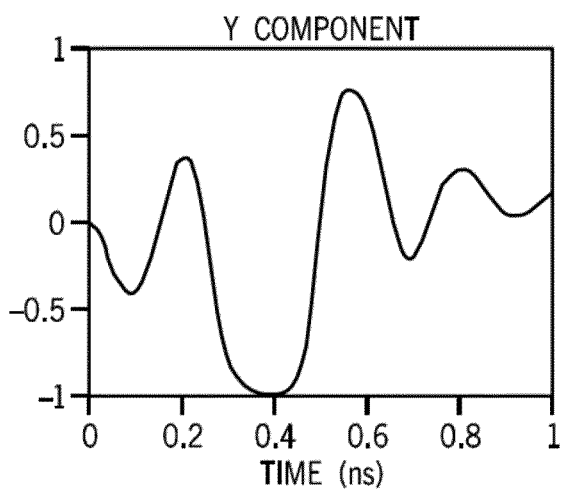
Figure 32C:
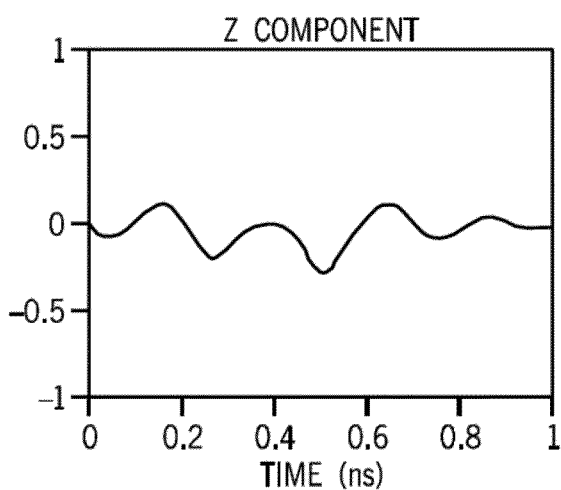
Figure 33A:
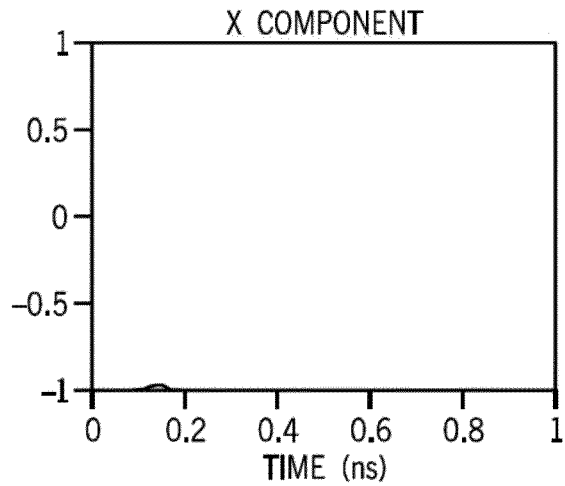
FIGS. 33(a)-33(c) show for conditions ($\beta$=5, $a_j$=+0.006, i.e. positive pulse polarities) there is no switching from the AP to P state, switching from the AP to P state only occurs for negative pulse polarities (FIGS. 32(a)-32(c)).
Figure 33B:
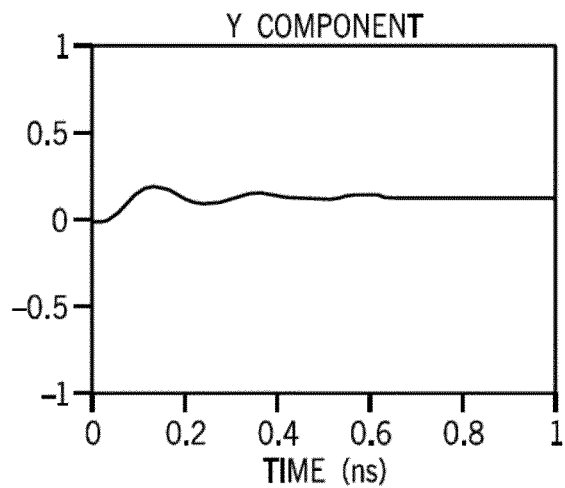
Figure 33C:
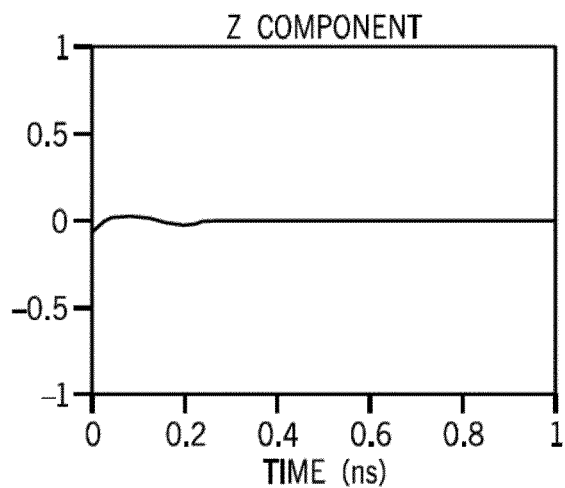

Analysis of this equation shows that the ratio $\beta$ (beta) is important in controlling the magnetization dynamics. Higher $\beta$ (greater than 1) results in a range of current pulse amplitudes in which the switching is directly from P to AP for one current polarity and AP to P for the other current polarity. For higher current amplitudes the switching is precessional (toggling from AP to P to AP and continuing, as shown experimentally in FIG. 22). The switching is bipolar in this case, occurring for both polarities. The device impedance is about 2-4 k Ohms as shown in FIGS. 27(a)-27(c).

For small beta (beta less than or about equal to 1) the range of current pulse amplitudes in which direct switching occurs is reduced. The motion for small $\beta$ becomes precessional (toggling from AP to P to AP and continuing, as was seen in experiments shown in FIG. 22). When the magnetization motion is precessional higher current amplitudes generally result in higher precession frequencies.

The presence of the polarizer (in all cases cited above) reduces the time needed to set the bit cell state (see FIGS. 26(a)-26(f)) improving device performance, both reducing the switching time and reducing the current (or voltage) amplitude needed for switching.

Calculations of the switching dynamics based on model described in Eqn. (2) above show the type of characteristics that can be found in OST-MRAM stacks. The behavior was determined for a thin film nanomagnet with in-plane anisotropy field (along x) of 0.05 T, damping ($\alpha$=0.01), magnetization density of $\mu M_s$=0.5T and the magnetization of the reference layer in the +x direction.

Example 3

In certain embodiments the reliable writing in which pulse duration is not critical. In such a case, for a memory operation, it may be preferable that the pulse duration not be a critical variable (i.e. the precise pulse duration would not determine the bit cell final state; only the pulse polarity—positive or negative—would be important. In this case, the device is provided with about equal to or greater than 1. This can be accomplished in a number of ways:

The spin-polarization from the reference layer can be increased by choice of materials for the magnetic tunnel junction and reference layer. For example, CoFeB in contact with MgO has a large spin-polarization. Permalloy (NiFe) in contact with MgO has a lower spin polarization.

The spin-polarization from the polarizing layer can be reduced. This can be accomplished in a number of ways, for example, without limitation:

a. Choice of materials for the composition of the polarizing layer: Co/Ni multilayers have a large spin-polarization. However, Co/Pd or Co/Pt have a much lower spin-polarization. A composite polarizing layer can have an adjustable polarization. For example a multilayer of Co/Ni on Co/Pd or Co/Pt in which the thickness of the Co/Ni is varied (from, say 0.5 to 5 nm) is a means to control the current spin-polarization from the polarizing layer, where the Co/Ni is the layer in closer proximity to the free magnetic layer. A thin layer with large spin-orbit coupling, such as Pt or Pd, could also be placed on the surface of the polarizing layer closer to the free magnetic layer. This would also serve to reduce the current spin-polarization.

b. Alternatively, the nonmagnetic layer between the polarizer and the free layer can be varied to control the spin-polarization of carriers from the polarizing layer (and thus the parameter $\beta$). If this layer has a short spin-diffusion length the polarization would be reduced. Including defects in Cu can reduce its spin-polarization (e.g., Ni in Cu or other elements). The Cu can also be an alloy with another element, such as Zn or Ge. There are many possible material combinations that would reduce the spin-polarization from the polarizing layer.

For fast low energy switching it would be preferable to not increase $\beta$ far beyond 10, because the torque from the perpendicular polarizer sets the switching time and thus the energy required to switch the device (as discussed above).

For fastest write operation: $\beta$ preferably should be less than one, and the pulse timing needs to a very well-controlled variable. The switching is bipolar and only a single polarity voltage source is needed for device write operations, potentially simplifying the drive circuitry.

Analysis of the model described above also shows that the threshold voltage and current for switching can be reduced through a number of means. First, the free layer magnetization density or free layer thickness can be reduced. However, this also is expected to reduce the bit cell stability. So the magnetization density or free layer thickness cannot be made arbitrarily small. Second, the free layer can have a component of perpendicular magnetic anisotropy. This anisotropy would be insufficient in and of itself to reorient the magnetization perpendicular to the layer plane, but would nonetheless be effective in reducing the switching current and voltage. This kind of perpendicular anisotropy is seen in thin (0.5 to 3 nm thick) CoFeB layers in contact with MgO. The switching speed and free layer precession frequency depends on the free layer perpendicular anisotropy. Larger perpendicular anisotropy leads to lower frequency precession, reducing the switching speed. Third, the damping parameter of the free layer can be reduced to reduce the switching current and voltage. This and other means may be used to reduce the switching voltage and current threshold.

The following references are hereby incorporated by reference in their entirety: [1] S. Yuasa et al, Applied Physics Letters 89, 042505 (2006); [2] J-M. L. Beaujour, W. Chen, K. Krycka, C-C. Kao, J. Z. Sun and A. D. Kent, "Ferromagnetic resonance study of sputtered Co|Ni multilayers," The European Physical Journal B, 59, 475 (2007); [3] J-M. L. Beaujour, A. D. Kent and J. Z. Sun, "Ferromagnetic resonance study of polycrystalline Fe_{1-x}V_x alloy thin films" Journal of Applied Physics 103, 07B519 (2008); [4] K. Martens, D. L. Stein and A. D. Kent, "Magnetic reversal in nanoscopic ferromagnetic rings," *Physical Review B*, vol. 73, no. 5, p. 054413 (2006); and [5] G. D. Chaves-O'Flynn, A. D. Kent, and D. L. Stein, Physical Review B 79, 184421 (2009).

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A magnetic device comprising:
   a pinned magnetic layer with a magnetization vector having a fixed magnetization direction at a non-zero acute angle relative to a normal of a plane of the pinned magnetic layer;
   a free magnetic layer with at least one magnetization vector having a changeable magnetization direction, wherein the magnetization vector of the free magnetic layer has at least a first stable state and a second stable state, and wherein the first and second stable states both have magnetization directions that are perpendicular to a plane of the free magnetic layer; and
   a nonmagnetic layer spatially separating the pinned magnetic layer and the free magnetic layer, wherein application of a current pulse of sufficient amplitude and duration through the magnetic device switches the magnetization vector of the free magnetic layer between the first and second stable states.

2. The magnetic device of claim 1, further comprising:
   a reference magnetic layer having a fixed magnetization direction that is perpendicular to a plane of the reference magnetic layer; and
   a second nonmagnetic layer spatially separating the free magnetic layer and the reference magnetic layer.

3. The magnetic device of claim 1, wherein the pinned magnetic layer comprises platinum or an alloy of platinum.

4. The magnetic device of claim 1, wherein the free magnetic layer comprises platinum or an alloy of platinum.

5. The magnetic device of claim 1, wherein the nonmagnetic layer comprises an insulator.

6. The magnetic device of claim 5, wherein the insulator is MgO.

7. The magnetic device of claim 1, wherein the nonmagnetic layer comprises a nonmagnetic conductor.

8. The magnetic device of claim 2, wherein the nonmagnetic layer comprises a first insulator, and wherein the second nonmagnetic layer comprises a second insulator.

9. The magnetic device of claim 2, wherein the first insulator is MgO, and wherein the second insulator is MgO.

10. The magnetic device of claim 1, wherein the pinned magnetic layer is formed by deposition of high magnetic anisotropy materials on a substrate at a non-zero acute angle relative to a normal of a plane of the substrate.

11. The magnetic device of claim 2, further comprising:
    a control current source providing a current; and
    a write contact in contact with the control current source, wherein the write contact provides the current to the free magnetic layer or the reference magnetic layer.

12. The magnetic device of claim 1, wherein the free magnetic layer comprises four stable states.

13. The magnetic device of claim 1, wherein the current pulse combines a first current pulse and a second current pulse.

14. The magnetic device of claim 12, where a first amplitude of the first current pulse is less than the sufficient amplitude.

15. The magnetic device of claim 13, where a second amplitude of the second current pulse is less than the sufficient amplitude.

16. The magnetic device of claim 14, where a sum of the first amplitude and the second amplitude is greater than the sufficient amplitude.

17. A memory array comprising:
    a plurality of bit cells, wherein each bit cell includes:
      a magnetic device having:
        a pinned magnetic layer with a magnetization vector having a fixed magnetization direction at a non-zero acute angle relative to a normal of a plane of the pinned magnetic layer;
        a free magnetic layer with at least one magnetization vector having a changeable magnetization direction, wherein the magnetization vector of the free magnetic layer has at least a first stable state and a second stable state, and wherein the first and second stable states both have magnetization directions that are perpendicular to a plane of the free magnetic layer;
        a nonmagnetic layer spatially separating the pinned magnetic layer and the free magnetic layer, wherein application of a current pulse of sufficient amplitude and duration through the magnetic device switches the magnetization vector of the free magnetic layer between the first and second stable states; and
      at least one transistor for current control and readout; and
    a word line, wherein application of a voltage on the word line addresses and activates at least one bit cell of the plurality of bit cells.

18. The memory array of claim 17, wherein at least one bit cell comprises:
    a reference magnetic layer having a fixed magnetization direction that is perpendicular to a plane of the reference magnetic layer; and
    a second nonmagnetic layer spatially separating the free magnetic layer and the reference magnetic layer.

19. The memory array of claim 17, wherein the nonmagnetic layer comprises an insulator.

20. The memory array of claim 19, wherein the nonmagnetic layer comprises an insulator, and wherein the second nonmagnetic layer comprises an insulator.

* * * * *